us008264837B2

United States Patent
Pakula et al.

(10) Patent No.: US 8,264,837 B2
(45) Date of Patent: Sep. 11, 2012

(54) SYSTEMS AND METHODS FOR COVER ASSEMBLY RETENTION OF A PORTABLE ELECTRONIC DEVICE

(75) Inventors: David Pakula, San Francisco, CA (US); Scott Myers, San Francisco, CA (US); Tang Tan, Palo Alto, CA (US); Richard Dinh, San Jose, CA (US)

(73) Assignee: Apple Inc., Cupertino, CA (US)

( * ) Notice: Subject to any disclaimer, the term of this patent is extended or adjusted under 35 U.S.C. 154(b) by 164 days.

(21) Appl. No.: 12/794,467

(22) Filed: Jun. 4, 2010

(65) Prior Publication Data

US 2011/0255218 A1    Oct. 20, 2011

Related U.S. Application Data

(60) Provisional application No. 61/325,620, filed on Apr. 19, 2010.

(51) Int. Cl.
*H05K 7/00* (2006.01)
*G06F 1/16* (2006.01)

(52) U.S. Cl. ......... 361/679.58; 361/679.01; 361/679.56; 220/4.02; 455/575.1

(58) Field of Classification Search ............. 361/679.01, 361/679.56, 679.58; 220/4.02, 4.28; 455/575.1
See application file for complete search history.

(56) References Cited

U.S. PATENT DOCUMENTS

| | | | |
|---|---|---|---|
| 5,790,659 A | | 8/1998 | Strand |
| 7,660,560 B2 * | | 2/2010 | Zuo et al. ............... 455/90.3 |
| 7,697,269 B2 * | | 4/2010 | Yang et al. .............. 361/679.01 |
| 7,796,381 B2 * | | 9/2010 | Zuo et al. ................ 361/679.57 |
| 7,986,982 B2 * | | 7/2011 | Li et al. .................... 455/575.1 |
| 2009/0015994 A1 * | | 1/2009 | Liu ............................ 361/679 |
| 2009/0256759 A1 | | 10/2009 | Hill et al. |
| 2009/0267677 A1 | | 10/2009 | Myers et al. |
| 2011/0186325 A1 * | | 8/2011 | Myers et al. .................... 174/50 |
| 2011/0186345 A1 * | | 8/2011 | Pakula et al. ................ 174/520 |
| 2011/0187245 A1 * | | 8/2011 | Pakula et al. .............. 312/223.1 |
| 2011/0188179 A1 * | | 8/2011 | Myers et al. .............. 361/679.01 |
| 2011/0188180 A1 * | | 8/2011 | Pakula et al. ............. 361/679.01 |

FOREIGN PATENT DOCUMENTS

| | | |
|---|---|---|
| EP | 0 702 460 | 3/1996 |
| WO | WO 2008/128671 | 10/2008 |

* cited by examiner

*Primary Examiner* — Robert J Hoffberg
(74) *Attorney, Agent, or Firm* — Kramer Levin Naftalis & Frankel LLP

(57) ABSTRACT

This is directed to systems and methods for cover assembly retention of a portable electronic device. In some embodiments, a cover assembly and/or housing of an electronic device can include one or more retention features such as detents, hooks, tabs, extensions, screw plates, screw holes, shuttles, latches, or any combination of the above, for retaining the cover assembly to the housing. In some embodiments, one or more retention features can be included on an internal platform of the electronic device to retain the cover assembly. In some embodiments, a hidden screw feature can be included in a SIM tray slot of the electronic device. Once a SIM tray has been inserted into the SIM tray slot, the screw feature can be hidden from sight and may become unapparent to an end user of the electronic device.

7 Claims, 19 Drawing Sheets

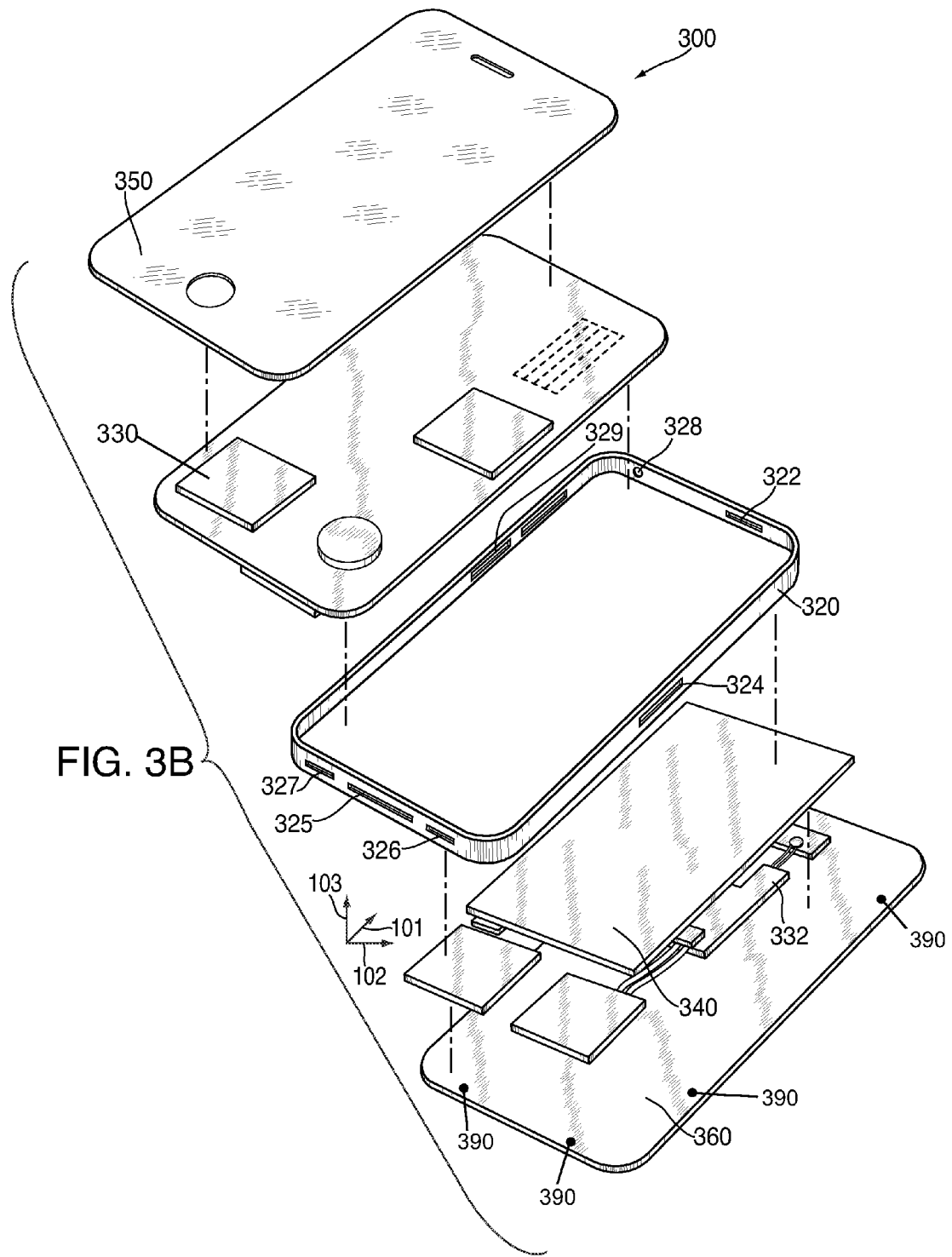

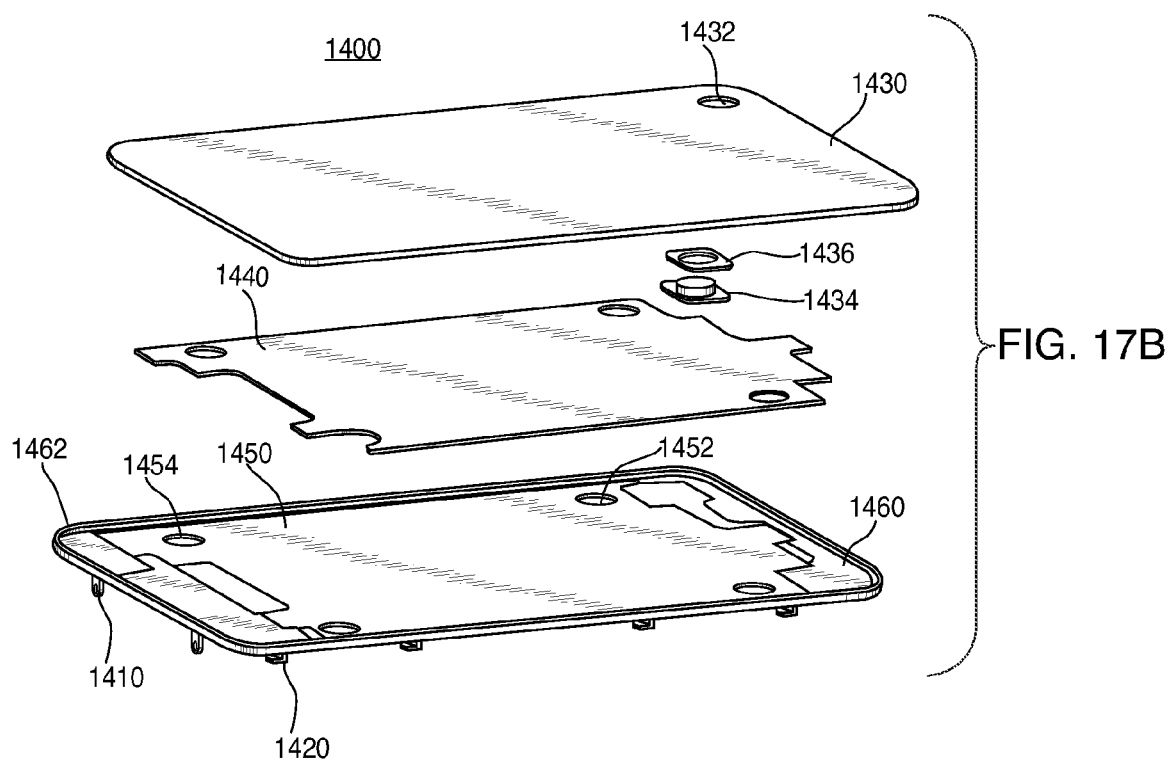

SYSTEMS AND METHODS FOR COVER ASSEMBLY RETENTION OF A PORTABLE ELECTRONIC DEVICE

CROSS-REFERENCE TO RELATED APPLICATIONS

This application claims the benefit of U.S. Provisional Patent Application No. 61/325,620, filed on Apr. 19, 2010, which is hereby incorporated by reference herein in its entirety.

FIELD OF THE DISCLOSURE

This is directed to cover assembly retention of a portable electronic device. For example, a cover assembly can be slid onto a housing assembly and retained to the housing assembly via detents, hidden screws, top hooks, or any combination of the above.

BACKGROUND OF THE DISCLOSURE

A portable electronic device can be constructed using any suitable approach. For example, a "bucket" type approach can be used in which a first housing component serves as a bucket into which inner electronic device components are placed, and a second housing component serves as a cover for the bucket. This arrangement secures the electronic device components between the first and second housing components. As an example, in the bucket configuration the cover can include a bezel and window that are assembled over the housing.

As another example, a portable electronic device can be constructed using a "tubular" approach in which electronic device components are inserted into a hollow housing element, such as a tubular structure (e.g., a flattened tube or a hollow rectangular tube). The electronic device components can be inserted into the tubular structure from one or both ends, and connected within the structure. The structure can be capped at one or both ends to ensure that the components remain fixed within the tubular structure, and to provide interface components (e.g., connectors, buttons, or ports) for the device.

SUMMARY OF THE DISCLOSURE

This is directed to cover assembly (e.g., top cover, backplate, and the like) retention of a portable electronic device. In some embodiments, one or more retention features can be included on the cover assembly and/or housing of an electronic device to retain the cover assembly. For example, the cover assembly can include one or more detent features, hooks, and screw plates that can interact with, respectively, one or more detents, latches, and screw holes of the housing to retain the cover assembly. In some embodiments, the detent feature and detent can include, respectively, a pin and detent spring. In some embodiments, the detent feature and detent can include, respectively, a latch and pawl.

In some embodiments, an internal platform of the electronic device can include one or more retention features to retain the cover assembly to the electronic device. For example, the internal platform can include a platform hook, and the cover assembly can include a top hook. Both hooks can couple together to retain the cover assembly to the electronic device.

In some embodiments, the cover assembly can be coupled to the housing by sliding the cover assembly onto the housing of the electronic device. In some embodiments, the cover assembly can be coupled to the electronic device by rotatably coupling the cover assembly to the housing. For example, the cover assembly can be rotated on a hinge following the short or long axis of the housing of the electronic device.

In some embodiments, a hidden screw can be included to retain the cover assembly of an electronic device. For example, a screw hole can be included in an inner surface of a SIM tray slot of the electronic device's housing. A screw can be inserted into this screw hole to retain the cover assembly (e.g., by inserting the screw through a complimentary screw plate of the cover assembly), and a SIM tray can then be inserted into the SIM tray slot. In this manner, the SIM tray may conceal the hidden screw from an end user of the electronic device, such that the end user may not readily know how or be able to open the electronic device.

BRIEF DESCRIPTION OF THE DRAWINGS

The above and other features of the invention, its nature and various advantages will be more apparent upon consideration of the following detailed description, taken in conjunction with the accompanying drawings in which:

FIG. 3B is an exploded view of the electronic device of FIG. 3A in accordance with some embodiments of the invention;

FIGS. 16, 17A, and 17B show back cover assemblies in accordance with some embodiments.

DETAILED DESCRIPTION

This relates to a cover assembly for providing access into and out of an electronic device. For example, in some embodiments the electronic device can include a housing that holds various electrical components. A cover assembly can then be positioned onto the housing to enclose and maintain the electrical components within the electronic device. To secure the cover assembly in place, retention features may be used to couple the cover assembly to the housing, thus inhibiting removal of the coupled cover assembly. For example, one or more detent features, screw features, hidden screw features, top hooks, shuttles, latches, or any combination of the above can be used to lock the cover assembly onto the housing.

Figure 1:
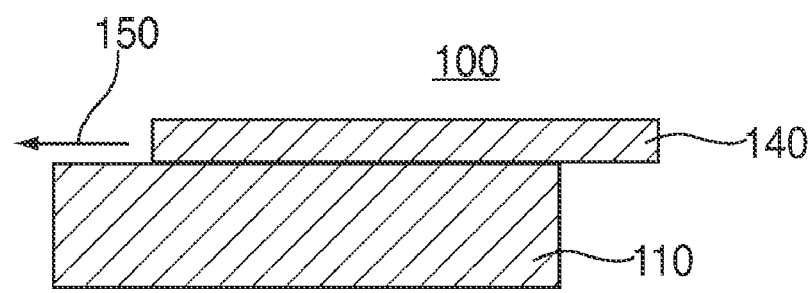
FIG. 1 is a side view of an illustrative electronic device in accordance with some embodiments of the invention.

FIG. 1 shows an illustrative electronic device 100. Electronic device 100 can include any suitable type of electronic device having a display, including for example a media player such as an iPod® available by Apple Inc., of Cupertino, Calif., a cellular telephone, a personal e-mail or messaging device (e.g., a Blackberry® or a Sidekick®), an iPhone® available from Apple Inc., pocket-sized personal computers, personal digital assistants (PDAs), a laptop computer, a desktop computer, a music recorder, a video recorder, a camera, radios, a gaming device, a remote control, medical equipment, and devices combining some or all of this functionality.

Electronic device 100 can be constructed using any suitable structure. For example, in some embodiments the electronic device 100 can be constructed using a "bucket" type approach in which a first housing component serves as a bucket into which inner electronic device components are placed, and a second housing component serves as a cover for the bucket. As used herein, the term "inner components" or "electrical components" can include any suitable components within the housing of the portable electronic device such as suitable circuitry, microchips, structural materials (e.g., walls, supports, latches, and the like), connectors (e.g., electrical, physical, or both), or any other suitable components. As another example, in some embodiments the electronic device 100 can be constructed using a "tubular" approach in which inner electronic device components are inserted into a hollow housing element. As yet another example, electronic device 100 can be constructed using a "band" approach (described in more detail below).

The surfaces of electronic device 100 can be any suitable shape. For example, each surface can be substantially planar, curved, or combinations of these. The surfaces can include one or more chamfers, detents, openings, dips, extensions, or other features modifying the smoothness of the surfaces.

Regardless of how the electronic device 100 is constructed, however, in some embodiments the device can be constructed such that it may not readily be taken apart after construction is complete. For example, constructing the electronic device in this manner may provide a stronger and more stable structure (e.g., the portable electronic device may not pop open when it is dropped or otherwise undergoes physical trauma). As another example, this may inhibit opening of electronic device 100, such that the inner components are not readily accessible.

As shown in FIG. 1, electronic device can include housing 110 and cover assembly 140. In some embodiments, cover assembly 140 can include a front cover assembly, such as a bezel and window that are assembled over housing 110. In some embodiments, cover assembly 140 can include a back cover assembly, such as a backplate that is assembled onto a back end of electronic device 100.

To position cover assembly 140 onto electronic device 100, cover assembly 140 can be tilted, hinged, slid, or otherwise positioned onto housing 110. For example, FIG. 1 illustrates that cover assembly 140 can be slid onto housing 110 in the direction of arrow 150. After being positioned onto housing 110, however, it may be desirable to lock cover assembly 140 in place such that its subsequent removal from housing 110 is inhibited. For example, retention features such as one or more detent features, screw features, hidden screw features, top hooks, shuttles, latches, or any combination of the above can be used to lock cover assembly 140 onto housing 110. Such retention features will be described in greater detail below.

Figure 2A:
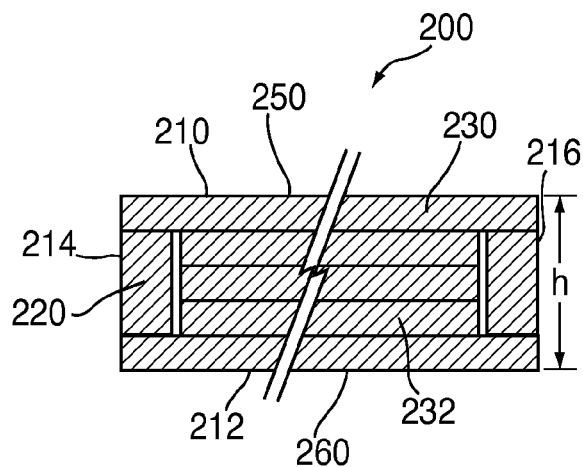
FIG. 2A is a cross-sectional view of an illustrative electronic device structure taken along the device width in accordance with some embodiments of the invention.
Figure 2B:
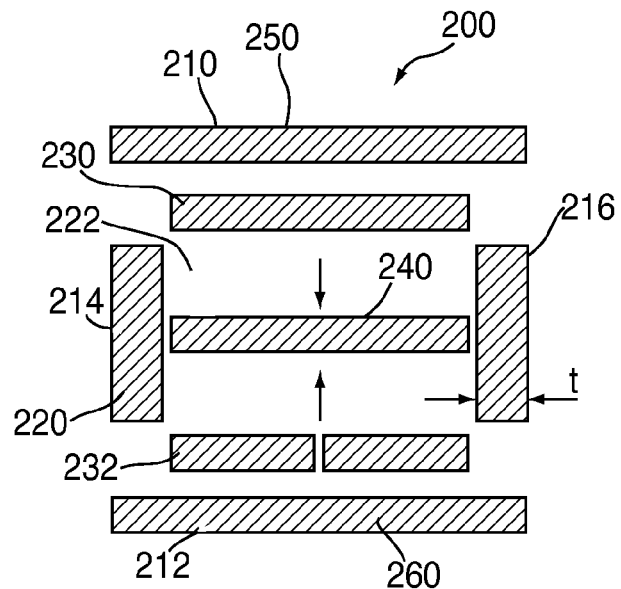
FIG. 2B is an exploded cross-sectional view of an illustrative electronic device taken along the device length in accordance with some embodiments of the invention.
Figure 2C:
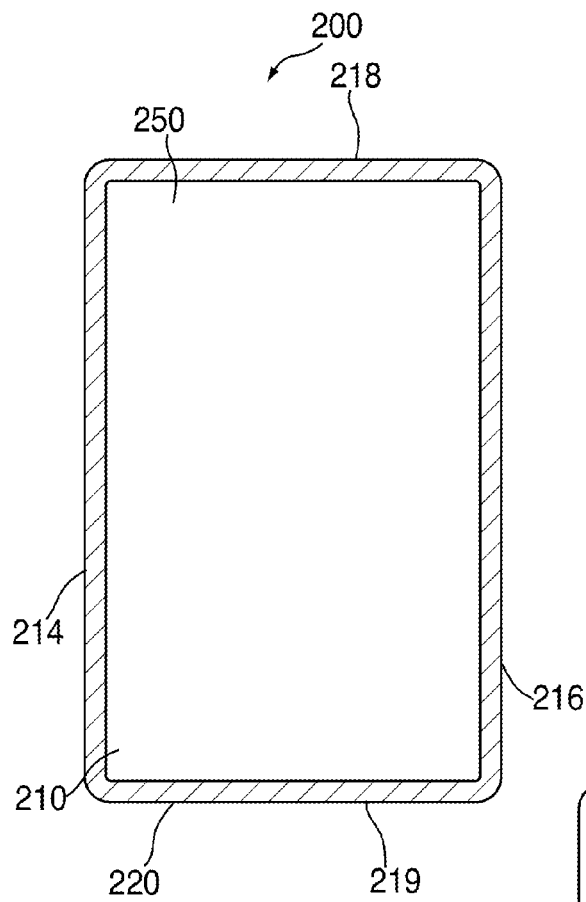
FIG. 2C is a top view of an illustrative electronic device in accordance with some embodiments of the invention.
Figure 2D:
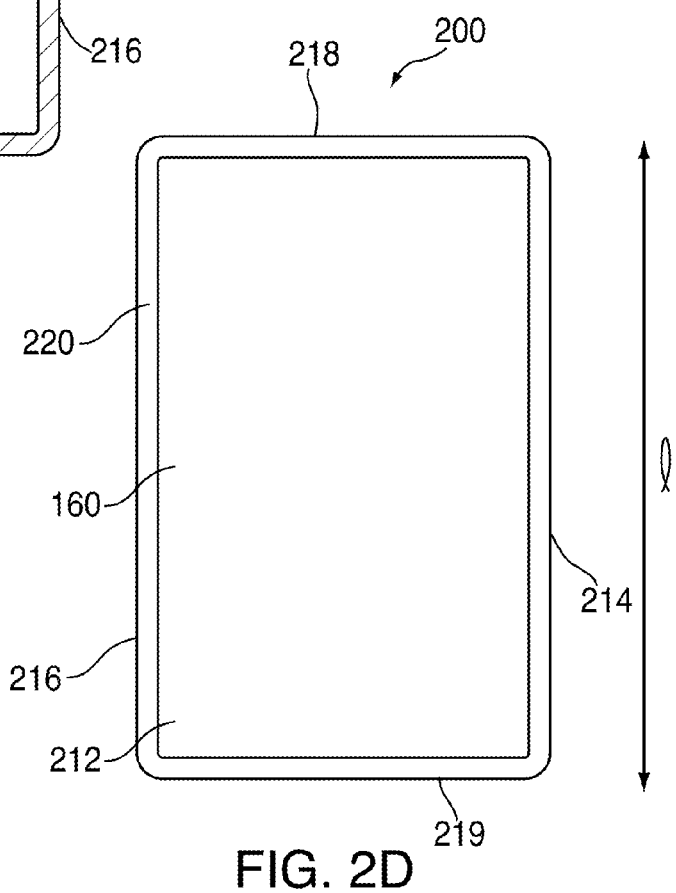
FIG. 2D is a bottom view of an illustrative electronic device in accordance with some embodiments of the invention.

FIG. 2A is a cross-sectional view of an illustrative electronic device structure taken along the device width in accordance with some embodiments of the invention. FIG. 2B is an exploded cross-sectional view of an illustrative electronic device taken along the device length in accordance with some embodiments of the invention. FIG. 2C is a top view of an illustrative electronic device in accordance with some embodiments of the invention. FIG. 2D is a bottom view of an illustrative electronic device in accordance with some embodiments of the invention.

Electronic device 200 of FIGS. 2A-2D can have any suitable shape, including for example a shape delimited by front surface 210, back surface 212, left surface 214, right surface 216, top surface 218 and bottom surface 219 (not shown in the cross-section).

Electronic device 200 can be constructed using any suitable structure. For example, in some embodiments the electronic device can be constructed using a "band" approach. In this approach, the structure of outer periphery member 220 can resemble a band that surrounds or wraps around some or all of electronic device 200. In this case, the external surfaces of outer periphery member 220 can define left surface 214, right surface 216, top surface 218, and bottom surface 219 of the device. Outer periphery member 220 may thus define an internal volume 222 into which electronic device components can be placed.

The outer periphery member can have a particular height (e.g., the device height h) such that the outer periphery member encloses volume 222 into which electronic device components (e.g., microchips, cameras, speakers, microphones, accelerometers, or other suitable components) can be assembled. The thickness (e.g., outer periphery member thickness t), length (e.g., device length l), height (e.g., device height h), and cross-section of the outer periphery member can be selected based on any suitable criteria including for example based on structural requirements (e.g., stiffness, or resistance to bending, compression, tension or torsion in particular orientations). In some embodiments, the outer periphery member can serve as a structural member to which other electronic device components can be mounted. The outer periphery member can include one or more depressions, recesses, channels, protrusions, or openings for supporting components or for providing structural support for the device. In some embodiments, an opening can be used to provide access to one or more internal components contained within the outer peripheral member.

Outer periphery member 220 (or device 200) can have any suitable cross-section. For example, outer periphery member 220 can have a substantially rectangular cross-section. In some embodiments, outer periphery member 220 can instead or in addition have a cross-section in a different shape, including for example a circular, oval, polygonal, or curved cross-section. In some embodiments, the shape or size of the cross-section can vary along the length or width of the device (e.g., an hourglass shaped cross-section).

Electronic device components can be placed within volume 222 using any suitable approach. For example, electronic device 200 can include components 230 and 232 that can be inserted into volume 222. Each of components 230 and 232 can include individual components, or several components assembled together as a component layer or stack, or include several distinct layers of components to insert within volume 222. In some embodiments, components 230 and 232 can each represent several components stacked along the height of the device. The component layers can be inserted into outer periphery member 220 using any suitable approach. For example, components 230 and 232 can all be inserted from front surface 210 or from back surface 212 (e.g., back to front, front to back, or middle to front and back). Alternatively, the components can be inserted from both front surface 210 and back surface 212.

In some embodiments, one or more of the components can serve as a structural element. Alternatively, electronic device 200 can include a distinct structural element placed within volume 222 and coupled to outer periphery member 220. For example, electronic device 200 can include one or more internal members or platforms 240, which can serve as a mounting points or regions for helping secure, hold or pack one or more component layers (e.g., attaching component 230 to the back surface of internal platform 240, and component 232 to the front surface of internal platform 240). Internal platform 240 can be coupled to outer periphery member 220 using any suitable approach, including for example using snaps, fasteners, flexures, welds, glue, or combinations of these. Alternatively, internal platform 240 may even be part of the outer periphery member (e.g., machined, extruded, or cast, or integrally formed as a single unit). The internal platform can have any suitable size, including for example a size that is smaller than the internal volume of outer periphery member 220.

Internal platform 240 can be positioned at any suitable height within outer periphery member 220, including for example substantially at half the height of outer periphery member 220. The resulting structure (e.g., outer periphery member 220 and internal platform 240) can form an H-shaped structure that provides sufficient stiffness and resistance to tension, compression, torsion and bending.

Internal platform 240, inner surfaces of the outer periphery members, or both can include one or more protrusions, depressions, shelves, recesses, channels, or other features for receiving or retaining electronic device components. In some cases, internal platform 240, outer periphery member 220 or both can include one or more features for coupling a cover assembly to the electronic device. For example, internal platform 240 can include a hook that can latch onto a complimentary structure located on a cover assembly, thus retaining the cover assembly to electronic device 200.

Electronic device 200 can include front cover assembly 250 and back cover assembly 260 (i.e., a "backplate") defining the front and back surfaces, respectively, of device 200. In some embodiments, front cover assembly 250 and/or back cover assembly 260 can include one or more retention features for locking the cover assembly onto electronic device 200. For example, one or more detent features, screw features, hidden screw features, top hooks, shuttles, latches, or any combination of the above can be used to lock cover assembly 140 onto housing 110. Such retention features will be described in greater detail below.

The front and back cover assemblies can include one or more components, or can include at least a front member and a back member that form some or all of the outer front and back surfaces of the device. Front and back cover assemblies 250 and 260 can be flush, recessed or protruding relative to the front and back surfaces of outer periphery member 220. In some embodiments, one or both of front and back cover assemblies 250 and 260 can include delicate or fragile components. To protect the components from damage during use or when dropped, one or both of the cover assemblies can be flush or sub flush relative to the outer periphery member to prevent edges from engaging other surfaces. Alternatively, the one or more of the cover assemblies can protrude above the edge of the outer peripheral member. In some embodiments, one or both of front cover assembly 250 and back cover assembly 260 can include one or more windows through which content generated by display circuitry can be provided, or windows to which a cosmetic coating or finish can be applied.

Figure 3A:
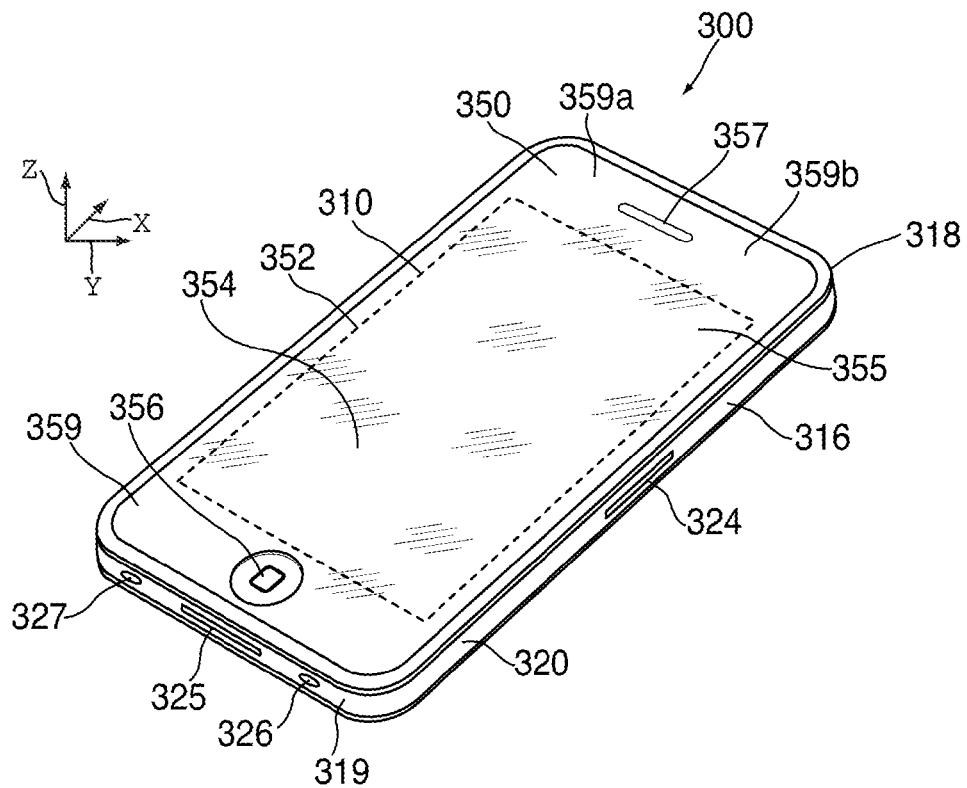
FIG. 3A is a schematic perspective view of an illustrative electronic device in accordance with some embodiments of the invention.
Figure 3C:
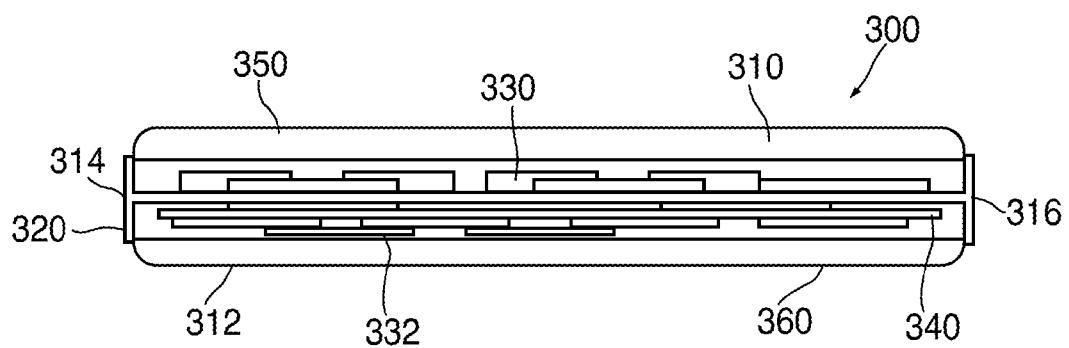
FIG. 3C is a cross-sectional view of the electronic device of FIG. 3A in accordance with some embodiments of the invention.

FIG. 3A is a schematic perspective view of an illustrative electronic device in accordance with some embodiments of the invention. FIG. 3B is an exploded view of the electronic device of FIG. 3A in accordance with some embodiments of the invention. FIG. 3C is a cross-sectional view of the electronic device of FIG. 3A in accordance with some embodiments of the invention. The electronic device of FIGS. 3A-3C can include some or all of the features of the electronic device of FIGS. 2A-2D. In particular, components having similar numbers can share some or all features. Outer periphery member 320 can surround the periphery of electronic device 300 to form some or all of the outer-most side, top and bottom surfaces (e.g., surfaces 310, 312, 314, 316, 318 and 319) of the electronic device. Outer periphery member 320 can have any suitable shape, including one or more elements that can be combined to form a ring. For example, outer periphery member 320 can include a band-shaped structure, such as when electronic device 300 is constructed using a "band" approach (e.g., as opposed to a bucket or tubular approach).

The band-shape of outer periphery member 320 can enclose volume 322 into which electronic device components can be assembled and retained. The shape of outer periphery member 320 can define the boundaries of volume 322, and therefore can be determined based on the size and type of components placed within volume 322. The boundaries of volume 322 (e.g., determined by the shape of outer periphery member 320) can have any suitable shape, including for example a substantially rectangular shape (e.g., having straight or rounded edges or corners), a circular shape, an oval shape, a polygonal shape, or any other closed shape that can define a volume.

The outer periphery member can have any suitable cross-section, including for example a variable cross-section or a constant cross-section. In some embodiments, the cross-section of the ring can be selected based on desired structural properties for the outer periphery member. For example, the cross-section of outer periphery member 320 can be substantially rectangular, such that the height of the outer periphery member is substantially larger than the width of the outer periphery member. This can provide structural stiffness in compression and tension, as well as bending. In some embodiments, the dimensions of the outer periphery member cross-section can be determined relative to the dimensions of the internal platform cross section.

In some embodiments, outer periphery member 320 can include one or more openings, knobs, extensions, flanges, chamfers, or other features for receiving components or elements of the device. In particular, outer periphery member 320 can include a slot or opening 324 for receiving a card or tray within the device. Opening 324 can be aligned with one or more internal components operative to receive and connect to an inserted component (e.g., an inserted SIM card). In some embodiments, opening 324 can provide for a hidden screw feature to retain a cover assembly to electronic device 300. For example, a screw hole can be included in opening 324 and a complimentary screw hole can be included in a cover assembly. A single screw may then be passed through both screws holes to retain the cover assembly to electronic device 300. A SIM tray (e.g., or other suitable, insertable component) may then be placed into opening 324, thereby hiding the screw feature from plain view.

In some embodiments, outer periphery member 320 can include connector opening 325 (e.g., for a 30-pin connector) through which a connector can engage one or more conductive pins of electronic device 300. Outer periphery member 320 can include openings 326 and 327 for providing audio to a user (e.g., an opening adjacent to a speaker), or receiving audio from a user (e.g., an opening adjacent to a microphone). Outer periphery member 320 can instead or in addition include an opening for an audio connector or power supply (e.g., opening 328), or features 329 for retaining and enabling a button such as a volume control or silencing switch.

In some embodiments, outer periphery member 320 can have a functional use or purpose in addition to serving as a cosmetic component or as a structural component. For example, outer periphery member 320 can be used as part of an antenna for capturing electromagnetic waves radiated as part of a communications network. In some cases, outer periphery member 300 can be used as parts of more than one antenna.

In some embodiments, one or more portions of outer periphery member 320 can be treated to provide an aesthetically pleasing component. In particular, left surface 314, right surface 316, top surface 318, and bottom surface 319 can be treated using a cosmetic surface treatment such as, for example, polishing, coating (e.g., using a dye or coloring material, or a material providing an optical effect), glazing, thin film deposition, grinding, superfinishing, or any other suitable process. In some embodiments, front or back surfaces of outer periphery member can instead or in addition be provided with a cosmetic treatment (e.g., for regions of the outer periphery member that may not be covered by back and front cover assemblies 360 and 350).

To provide sufficient resistance to all types of deformation, electronic device 300 can include a structural component placed within volume 322. In some embodiments, one or more of the internal components of the electronic device can be connected to the outer periphery member and serve as a structural component. For example, a circuit board (with or without a separate stiffening element) can be connected to opposite portions of outer periphery member 320. Alternatively, a distinct and dedicated structural component can be coupled to outer periphery member 320. In the example of FIGS. 3A-3C, electronic device 300 can include internal platform 340 forming a distinct structural component of the electronic device. Internal platform 340 can include any suitable shape, including for example a substantially planar shape. In some embodiments, internal platform 340 can include several distinct regions, such as a primary region and step regions extending from the primary region to engage one or more features of outer periphery member 320.

Internal platform 340 can cover any suitable area within volume 322. For example, internal platform 340 can only cover a portion of the area enclosed by outer periphery member 340, such as at least 60%, 70%, 80%, 90%, or more. Internal platform 340 can include any suitable features for securing or connecting electronic device components, such as one or more snaps, prongs, chamfers, extends, openings, access points, doors, or combinations of these. In some embodiments, internal platform 340 can include features for retaining a cover assembly to electronic device 300. For example, internal platform 340 can include a hook feature that can couple to a complimentary feature of the cover assembly, thereby securing the cover assembly to internal platform 340 (e.g., and also to electronic device 300). In some cases, internal platform 340 can include one or more dedicated features for receiving or securing specific electrical components, such as speakers, microphones, audio jacks, cameras, light sources, chips, or combinations of these.

Internal platform 340 can be constructed using any suitable approach. In some embodiments, internal platform 340 can be constructed from a single material or as a combination of several materials. For example, internal platform 340 can include one or more metal elements (e.g., included in extensions used to connect internal platform 340 to outer periphery member 320) around which a plastic can be molded to form internal platform 340. Some portions of the metal elements of internal platform 340 can extend beyond the edges of the plastic periphery so that the internal platform can be coupled to the outer periphery member via the metal elements. For example, the exposed metal elements can be connected to the outer periphery member using welding, soldering, heat staking, an adhesive, tape, a fastener, or any other connection mechanism. The outer periphery member can include one or more counterpart features on internal surfaces of the outer periphery member for retaining or receiving internal platform 340. The connection between the metallic portions of internal platform 340 and outer periphery member 320 can serve to ground particular electronic device components (e.g., components 330 and 332).

In some embodiments, internal platform 340 can be placed within the height of outer periphery member 320 such that components 330 and 332 can be placed on both the front and back surfaces of internal platform 340. For example, components 330 can be inserted from back surface 312, and components 332 can be inserted from front surface 310. Components 330 and 332 can be coupled to internal platform 340 for security, and can instead or in addition be electrically connected to each other through an opening in internal platform 340. In some embodiments, some components 330 and 332 can first be coupled to back and front cover assemblies 360 and 350, respectively, before being inserted in volume 322 and coupled to outer periphery member 320. In effect, by its position internal platform 340 can define back and front pockets or regions within volume 322 in which electronic device components can be placed. The size of each pocket or region can be determined based on any suitable criteria, including for example the number and size of components to place in each region, the required position of internal platform 340 relative to outer periphery member 320 (e.g., if available positions are limited due to structural requirements), or combinations of these.

To retain components within volume 332, electronic device 300 can include back cover assembly 360 and front cover assembly 350 providing the back and front surfaces of the electronic device, respectively. Each cover assembly can be coupled to outer periphery member 320 using any suitable approach, including for example using an adhesive, tape, mechanical fastener, hooks, tabs, or combinations thereof. In addition, although outer periphery member 320, internal platform 340, front cover assembly 350 and back cover assembly 360 are illustrated as separate components in FIGS. 3A-C, one skilled in the art could appreciate that one or more of these components could alternatively be formed from a single piece of material (e.g., outer periphery member 320 and front cover assembly 350 can be formed from a single piece of material, such that a separate step of coupling outer periphery member 320 to front cover assembly 350 may not be necessary).

In some embodiments, one or both of cover assemblies 350 and 360 can be removable, for example for servicing or replacing electronic device components (e.g., a battery). Alternatively, one or both of front cover assembly 350 and back cover assembly 360 can be permanently or semi-permanently affixed, for example to prevent and/or make it difficult to open electronic device 300. Permanently and/or semi-permanently affixing front cover assembly 350 and back cover assembly 360 in this manner may inhibit opening up of device 300, tampering of the inner components of device 300, and the like. As another example, permanently and/or semi-permanently affixing front cover assembly 350 and back cover assembly 360 can strengthen electronic device 300 by, for example, preventing device 300 from opening when it is dropped, hit against another object, or otherwise undergoes physical trauma.

In some embodiments, the surfaces of front cover assembly 350 and back cover assembly 360 can include any suitable feature, including for example one or more ridges, hooks, tabs, extensions, detents, or any combination thereof for retaining the covers or ensuring proper alignment of the covers. The features of cover assemblies 350 and 360 can interact with corresponding features of outer periphery member 320 (e.g., or other components of the electronic device) to ensure proper placement and alignment of the covers. Moreover, cover assemblies 350 and 360 can include several distinct parts, including for example a fixed part and a removable part.

Back cover assembly 360 and front cover assembly 350 can be constructed from any suitable material or combination of materials. In some embodiments, each of cover assemblies 350 and 360 can be constructed by combining several distinct components. For example, one or both cover assemblies can include a transparent or translucent plate (e.g., a rectangular plate of glass). As another example, one or both cover assemblies can include a base or support structure constructed from one or more of a metal or plastic (e.g., aluminum) onto which a transparent component can be assembled. The transparent component can be assembled using any suitable approach, including for example such that one or more electronic device components can be visible through the transparent component (e.g., display circuitry), or can receive signals or detect a user's environment through the transparent component (e.g., sensors). Alternatively, one or more portions of the transparent plate can be rendered opaque (e.g., using an ink, or by placing a support structure behind the transparent plate) such that the transparent plate can primarily serve as a cosmetic component. These different components of each cover assembly can be assembled using any suitable approach, including for example using one or more of an adhesive, fastener, tape, interlocking components, overmolding or manufacturing process, or any combination of these.

In some embodiments, one or more retention features can be included on back cover assembly 360. For example, as illustrated by FIG. 3B, one or more instance of retention feature 390 can be included. Moreover, although a certain number of instances and particular locations for retention features 390 are illustrated, this is for illustration and any other suitable number or location could alternatively be used. For example, one or more retention features could be positioned on the inside surface of back cover assembly 360, the outside surface of back cover assembly 360 (e.g., surface 312), along the periphery or edges of back cover assembly 360, in any other suitable location on back cover assembly 360, or any combination of the above. Retention feature 390 can include, for example, one or more detent features, screw features, hidden screw features, top hooks, shuttles, latches, any other suitable features for retaining back cover assembly 360, or any combination of the above. In some embodiments, outer periphery member 320 can include one or more complimentary features for interacting with retention feature 390 to couple back cover assembly 360 to outer periphery member 320. Such retention features and complimentary features will be described in greater detail in the descriptions and figures to follow.

In the example of FIGS. 3A-3C, front cover assembly 350 can include support structure 352 on which glass plate 354 is assembled. Support structure 352 can include one or more openings, including an opening through which display 355 can be provided. In some embodiments, support structure 352 and glass plate 354 can include openings for device components, such as button opening 356 and receiver opening 357. The size and shape of the openings can be selected using any suitable approach, including for example based on the size and shape of the device components placed in or underneath the openings (e.g., opening 356 can determined by the size of the button, while opening 357 can be determine from the size of the receiver, and acoustic considerations for providing sufficient audio to a user).

In some embodiments, glass plate 354 can include a cosmetic finish hiding from view internal components of the electronic device. For example, an opaque layer can be applied to region 359 surrounding display 355 to hide from view the non-display portions of the display circuitry. Because one or more sensors may receive signals through glass plate 354, the opaque layer can be selectively removed, or selected to allow signals to pass through the glass plate to the sensor behind the plate. For example, glass plate 354 can include regions 359a and 359b through which sensors (e.g., a camera, infrared sensor, proximity sensor, or ambient light sensor) can receive signals.

In some embodiments, front cover assembly 350 can support or enable one or more interfaces by which a user can use the electronic device. For example, glass plate 354 can support a touch interface (e.g., a touch pad or a touch screen) for controlling electronic device processes and operations. As another example, front cover assembly 350 can include one or more buttons or sensors (described above) for interacting with the device. In some cases, buttons, switches or other interface elements can be instead or in addition incorporated in outer periphery member 320 or back cover assembly 360. Electronic device 300 can include any other suitable interface for interacting with a user, including for example display circuitry, a projector, audio output circuitry (e.g., speakers or a an audio port), a haptic interface (e.g., a motor for creating vibrations, or a power source for providing an electrical stimulus), or combinations of these.

To enhance the cosmetic or aesthetic appeal of electronic device 300, one or all of outer periphery member 320, front cover assembly 350 and back cover assembly 360 can be finished using an appropriate process. For example, one or more of polishing, coating (e.g., using a dye or coloring material, or a material providing an optical effect), glazing, thin film deposition, grinding, superfinishing, or any other suitable process can be applied to electronic device components. In some embodiments, one or more glass surfaces (e.g., of front cover assembly 350 or of back cover assembly 360) can be finished to provide an aesthetically pleasing appearance, for example using one or more masks, coatings (e.g., photochromatic or dichroic), ink layers, or combinations of these. The particular finishes applied to the glass surfaces of front cover assembly 350 and back cover assembly 360 can be selected so that front and back surfaces 310 and 312 have similar or different appearances. In some embodiments, a glass surface can be treated to resist wear or impacts (e.g., scratch resistance), oils from touching, or any other external force applied to the device.

Figure 4A:
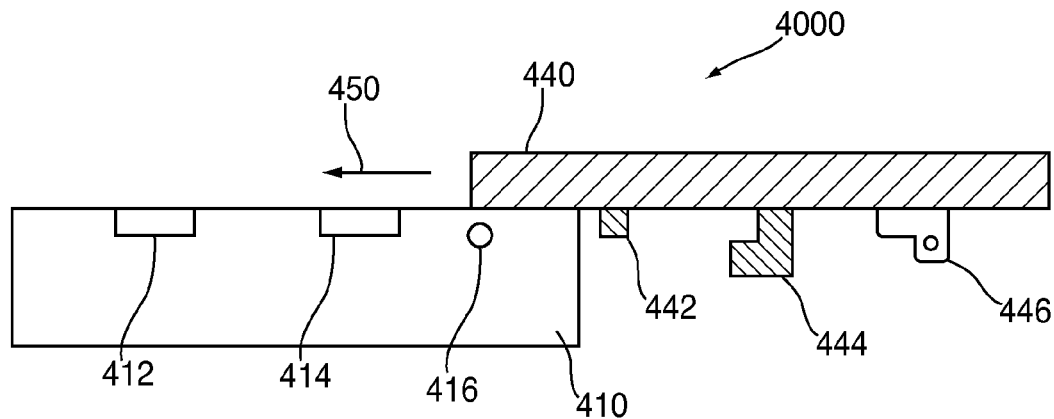
FIGS. 4A and 4B are schematic views of features for retaining a back cover assembly when the back cover assembly is slid onto a housing in accordance with some embodiments.
Figure 4B:
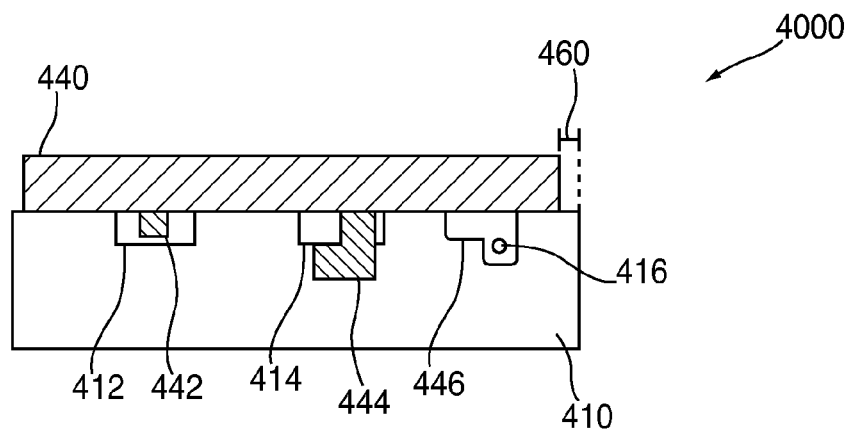

In some embodiments, various retention features can be included on a cover assembly, housing, or both of an electronic device to couple the cover assembly to the housing. For example, FIGS. 4A and 4B show housing 410 and back cover assembly 440 of portable electronic device 4000 that can include such features. Moreover, although various embodiments are described herein with respect to retaining a back cover assembly to an electronic device, one skilled in the art could appreciate that these embodiments could alternatively or alternative be used to retain any suitable cover assembly. For example, the embodiments described herein could be used to retain a front cover assembly, such as front cover assembly 350 of FIG. 3, to an electronic device.

Portable electronic device 4000 can include any suitable electronic device with a housing (e.g., to hold inner components, and the like) and a back cover assembly to cover the housing (e.g., to constrain the inner components within the housing, to provide a cosmetic outer shell for electronic device 4000, and the like). As one illustration, electronic device 4000 can correspond to electronic device 200 of FIGS. 2A-2D. In this case, back cover assembly 440 can correspond to back cover assembly 260 of electronic device 200, and housing 410 can correspond to outer periphery member 220 or a combination of outer periphery member 220, front cover assembly 250, and/or internal platform 240 of electronic device 200.

To retain back cover assembly 440 to housing 410, back cover assembly 440 can include features such as, for example, one or more instances of detent feature 442, hook 444, screw plate 446, or any combination of the above. Housing 410 can likewise include one or more features to interact with detent feature 442, hook 444, and screw plate 446. For example, housing 410 can include one or more instances of detent 412, latch 414, and screw hole 416 that can interact with, respectively, detent feature 442, hook 444, and screw plate 446 to retain back cover assembly 440 to housing 410. Although only a single instance of detent feature 442, hook 444, screw plate 446, detent 412, latch 414, and screw hole 416 are shown in FIGS. 4A and 4B, this is for the purpose of illustration and not for limitation and one skilled in the art could appreciate that any suitable number or combination of these features could alternatively be included.

In some embodiments, back cover assembly 440 can be slid onto housing 410 along, for example, direction 450. To facilitate the sliding, housing 410 may include grooves or other suitable guides (not shown) to lead back cover assembly 440 into housing 410. In some embodiments, back cover assembly 440, housing 410, or both can include one or more chamfers (not shown) to aid in the sliding and/or to prevent the components electronic device 4000 from forcibly chaffing or hitting one another.

FIG. 4B shows a positioning of housing 410 and back cover assembly 440 after back cover assembly 440 has been slid into place. As illustrated in FIG. 4B, after back cover assembly has been slid into place, detent feature 442 can interact with detent 412, hook 444 can interact with latch 414, and/or screw plate 446 can interact with screw hole 416 to retain back cover assembly 440 to housing 410. For example, screw hole 416 can align with screw plate 446, such that a screw can be inserted through these features to couple back cover assembly 440 to housing 410. As another example, as back cover assembly 440 is slid in direction 450, hook 444 can lock onto latch 414 to retain back cover assembly 440 in place. As yet another example, detent feature 442 can pass through detent 412 as back cover assembly 440 is moved in direction 450. The structures of detent feature 442 and detent 412 can be such that detent feature 442 cannot readily move backwards after passing through detent 412. In this manner, detent feature 442 and detent 412 can cooperate to couple back cover assembly 440 onto housing 410 and/or inhibit the subsequent removal of back cover assembly 440. Various structures and operations of detent 440 and detent 412 will be discussed in greater detail below.

As another example, such retention features can be used to guide back cover assembly 440 and ensure proper alignment of back cover assembly 440. For example, the retention features can ensure proper alignment of inner components with complimentary features of the cover assembly (e.g., a camera component can align with a complimentary hole in the cover assembly, and the like).

In some embodiments, the lengths and widths of back cover assembly 440 and housing 410 can be substantially the same (e.g., providing a seamless interface between the back cover assembly and the housing). Alternatively, in some embodiments, back cover assembly 440 may have a length and/or width that is smaller than the length and/or width, respectively, of housing 410 (e.g., such that back cover assembly 440 covers only a portion housing 410). For example, FIG. 4B illustrates back cover assembly 440 that is smaller than housing 410, thus forming gap 460 between the edges of back cover assembly 440 and housing 410 when back cover assembly 440 has been slid into place.

Figure 5:
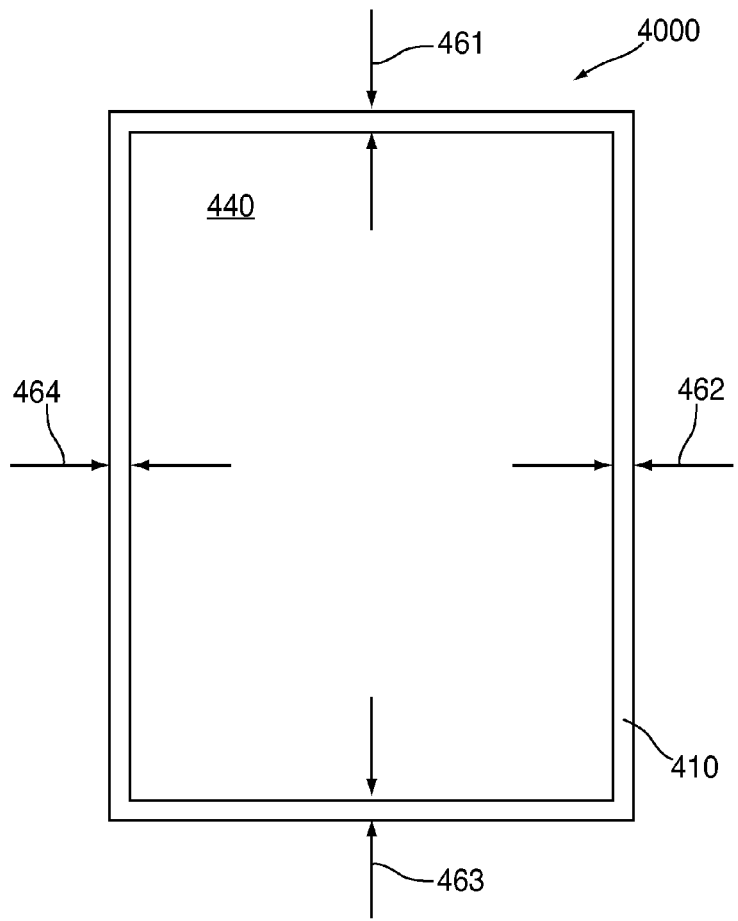
FIG. 5 is a bottom view of an electronic device in accordance with some embodiments.

In some embodiments, it may be desirable to keep the size of a gap, such as gap 460, uniform around the entire boundary of an electronic device. For example, FIG. 5 shows a bottom view of electronic device 4000 in which the lengths and widths of back cover assembly 440 are smaller than the lengths and widths of housing 410, thus resulting in gaps 461, 462, 463, and 464. Accordingly, in order for these gaps to be uniform around the boundary of electronic device 4000, the size of gaps 461-464 can be substantially equal. Keeping the size of these gaps substantially equal may, for example, provide a pleasing aesthetic appearance for the electronic device, help maintain a proper alignment of inner components within electronic device 4000, and the like. In some embodiments, guide features and/or retention features such as detent feature 442, hook 444, screw plate 446, detent 412, latch 414, and screw hole 416 of FIGS. 4A and 4B can align back cover assembly 440 and housing 410 such that gaps 461-464 are substantially equal.

Figure 6:
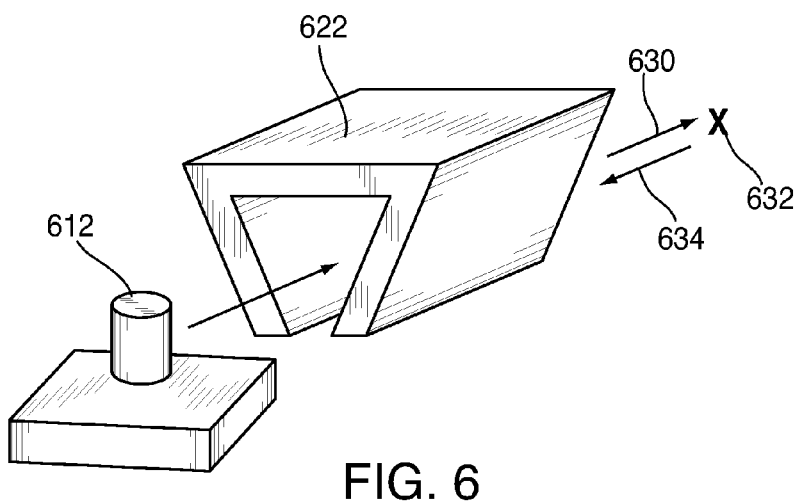
FIGS. 6 and 7 are schematic views of detent features in accordance with some embodiments.

As mentioned above, in some embodiments detent features, such as detent feature 442 and detent 412 of FIGS. 4A and 4B, can be included on an electronic device to retain a cover assembly in position. These detent features can include any suitable shape or structure suitable for inhibiting the removal of a cover assembly. As one example, FIG. 6 shows pin 612 and detent spring 622 that can correspond to some embodiments of, respectively, detent feature 442 and detent 412 of FIGS. 4A and 4B. Pin 612 and detent spring 622 can be coupled to, respectively, a back cover assembly and a housing of an electronic device. When the back cover assembly is being slid onto the housing, detent spring 622 may expand to allow pin 612 to pass through it in direction 630. After passing through detent spring 622, pin 612 can arrive at position 632. However, due to the shape and/or material of detent spring 622, pin 612 can be unable to readily pass backwards through detent spring 622 after arriving at position 632. For example, when pin 612 is moving in direction 634 from position 632, detent spring 622 may not readily expand, thus inhibiting pin 612 from moving in direction 634 and effectively "locking" pin 612 into place near position 632. In this manner, pin 612 and detent spring 622 can cooperate to retain a back cover assembly of an electronic device to the device's housing.

Pin 612 can include any suitable material such as plastic, steel, any other suitable metal, or any other suitable material. In some embodiments, pin 612 can be formed from the same piece of material as the back cover assembly (e.g., pin 612 and the back cover assembly can be formed from a single mold). Alternatively, in some embodiments, pin 612 can be formed from a separate piece of material that can be coupled to the back cover assembly. Detent spring 622 can include any material suitable to function as a spring such as, for example, steel, plastic, or any other suitable material that can expand from and return to an original shape.

Figure 7:
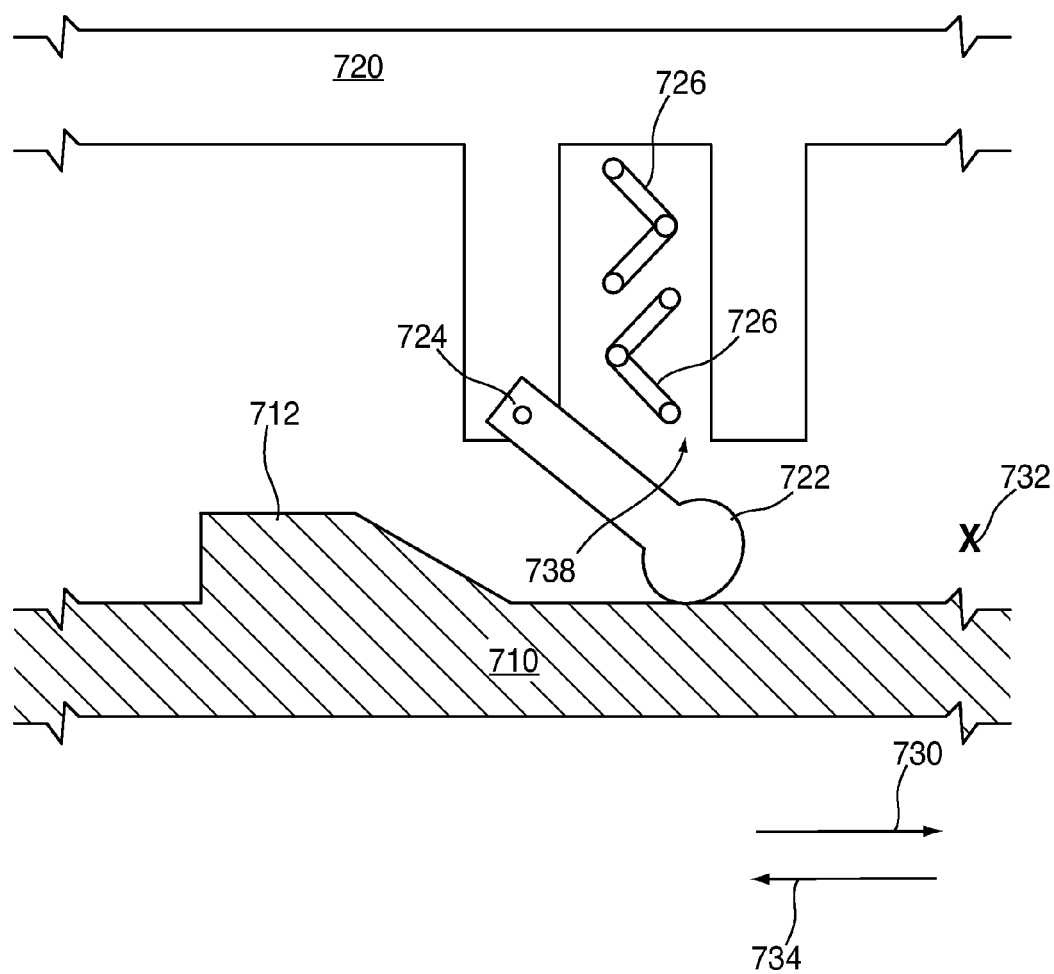

FIG. 7 shows another example of suitable detent features for inhibiting the removal of a back cover assembly in accordance with some embodiments. As shown in FIG. 7, back cover assembly 710 of an electronic device can include latch 712, and housing 720 of the same electronic device can include pawl 722. During the coupling of back cover assembly 710 to housing 720, back cover assembly 710 can be slid in direction 730. As back cover assembly 710 is being slid in direction 730, latch 712 can exert pressure on pawl 722, thereby causing pawl 722 to flex upwards in direction 738. As pawl 722 is flexed in direction 738, latch 712 can pass pawl 722 in direction 730 and arrive at position 732. However, due to the structure of latch 712, when back cover assembly 710 is moved in direction 734 after latch 712 has arrived a position 732, pawl 722 may be unable to move upwards in direction 738, thereby preventing back cover assembly 710 from moving backwards and effectively "locking" back cover assembly 710 in place. In this manner, latch 712 and pawl 722 can cooperate to retain a back cover assembly of an electronic device to the device's housing.

Latch 712 can include any suitable material such as plastic, steel, any other suitable metal, or any other suitable material. In some embodiments, latch 712 can be formed from the same piece of material as back cover assembly 710 (e.g., latch 712 and back cover assembly 710 can be formed from a single mold). Alternatively, in some embodiments, latch 712 can be formed from a separate piece of material that can be coupled to back cover assembly 710. Pawl 722 can include any suitable material such as plastic, metal, and the like. In some embodiments, pawl 722 can be coupled to housing 720 through hinge 724 to allow pawl 722 to rotatably move (e.g., in direction 738). In some embodiments, hinge 724 can include a spring structure to bias pawl 722 downwards against back cover assembly 710, thereby inhibiting the removal of back cover assembly 710. Alternatively or additionally, one or more instance of springs such as spring 726 can be included in housing 720 to bias pawl 722 downwards against back cover assembly 710.

Figure 8:
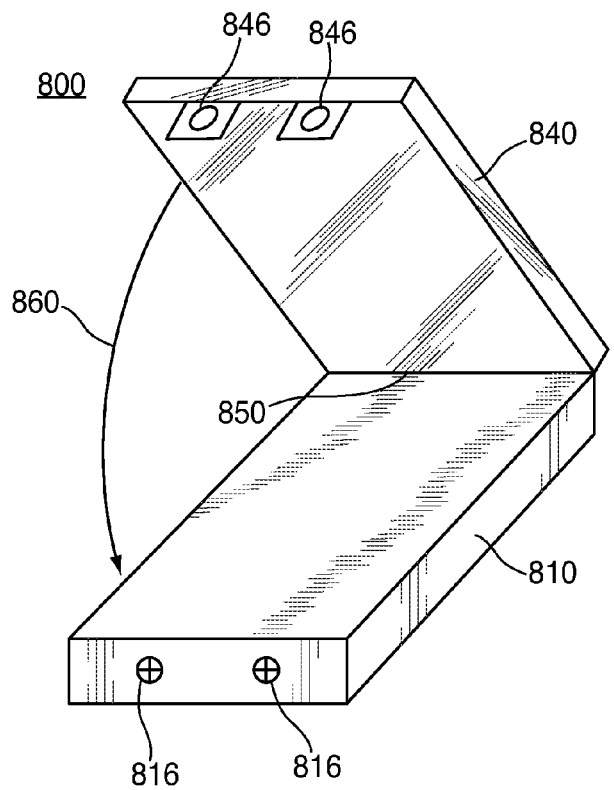
FIGS. 8 and 9 are schematic views of an electronic device in which the back cover assembly is rotatably coupled to the housing in accordance with some embodiments.

As mentioned above, to couple a back cover assembly of an electronic device to the device's housing, in some embodiments the back cover assembly can be slid onto the housing. Alternatively or additionally, in some embodiments the back cover assembly can be rotatably coupled to the housing. For example, FIG. 8 shows electronic device 800 including housing 810 and back cover assembly 840. To couple back cover assembly 840 to housing 810, back cover assembly 840 can be coupled along short axis 850 to housing 810. Back cover assembly 840 may then be rotated against housing 810 in direction 860.

In some embodiments, housing 810 and/or back cover assembly 840 can include one or more features to facilitate the retention of back cover assembly 840 against housing 810. For example, housing 810 can include one or more instance of screw hole 816 and back cover assembly 840 can include one or more instance of screw plate 846. When back cover assembly 840 has been rotated against housing 810, screw hole 816 can align with screw plate 846. This alignment may, for example, allow for a screw or other suitable object to be inserted through these features to couple back cover assembly 840 to housing 810. In addition to or instead of screw hole 816 and screw plate 846, one or more ridges, hooks, tabs, extensions, detents, latches, any other suitable feature, or any combination of the above can be used to retain back cover assembly 840 to housing 810.

Figure 9:
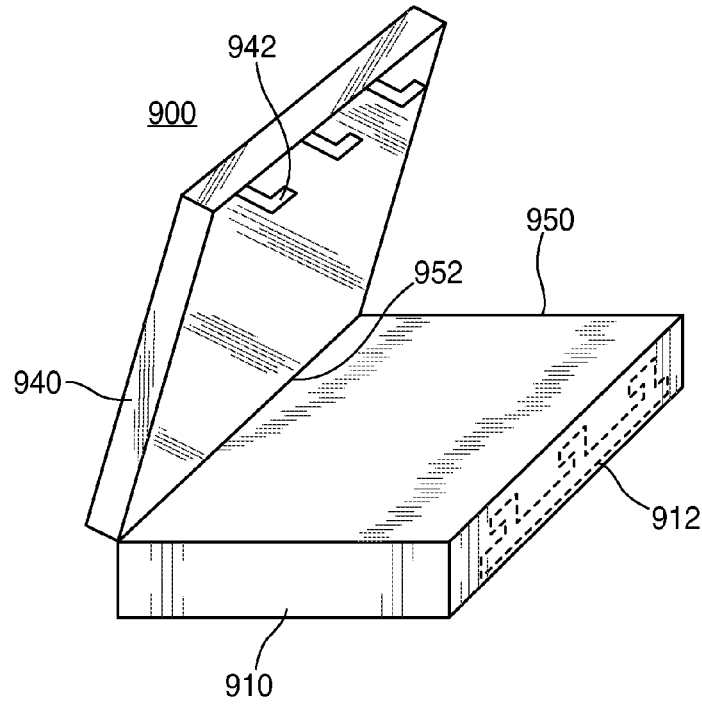

FIG. 9 shows another example of an electronic device including a back cover assembly that can be rotatably coupled to the device's housing. Similar to electronic device 800 of FIG. 8, electronic device 900 can include housing 910 and back cover assembly 940. However, dissimilar to electronic device 800 of FIG. 8, back cover assembly 940 of electronic device 900 can be coupled to housing 910 along long axis 952 (e.g., rather than be coupled along short axis 950). Coupling back cover assembly 940 along long axis 952 in this manner may, for example, more strongly retain back cover assembly 940 to housing 910 than if back cover assembly 940 had been coupled along short axis 950.

Similar to electronic device 800 of FIG. 8, housing 910 and/or back cover assembly 940 can include one or more features to facilitate the retention of back cover assembly 940 against housing 910 such as, for example, one or more screw holes, screw plates, ridges, hooks, tabs, extensions, detents, latches, any other suitable feature, or any combination of the above. In some embodiments, back cover assembly 940 can include one or more instance of latch 942 that can interact with shuttle 912 of housing 910 to retain back cover assembly 940 to housing 910. Shuttle 912 is drawn with dashed lines in FIG. 9 to indicate that it is located on the inner wall of housing 910 and is, therefore, hidden from sight when electronic device 900 is viewed from the angle depicted in FIG. 9. When back cover assembly 940 has been rotated against housing 910, shuttle 912 can be shifting back and forth, thus causing shuttle 912 to engage latch 942 and "lock" back cover assembly 940 against housing 910. For example, in some embodiments, a hole (not pictured) can be included in housing 910 to allow a user to access shuttle 912 through the hole (e.g., by using a small tool operable to fit through the hole). A user may then shift shuttle 912 to engage latch 942 and lock back cover assembly 940 to housing 910.

Figure 10:
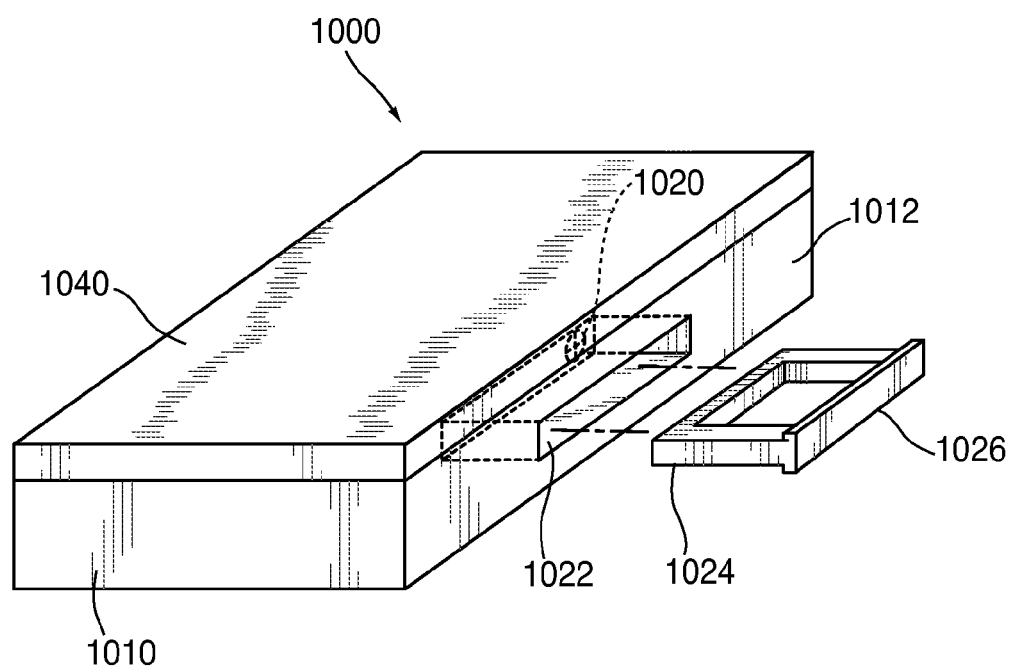
FIG. 10 is a schematic view of a hidden screw feature in an electronic device in accordance with some embodiments.

In some embodiments, a "hidden screw" feature can be used to retain a back cover assembly to a housing of an electronic device. For example, FIG. 10 shows electronic device 1000 that can include housing 1010 and back cover assembly 1040. Housing 1010 can be coupled to back cover assembly 1040 through any suitable method such as, for example, sliding on the back cover assembly (e.g., FIGS. 4A and 4B), rotatably coupling the back cover assembly (e.g., FIGS. 8 and 9), or through any other suitable method. Moreover, electronic device 1000 can include hidden screw hole 1020 to retain back cover assembly 1040 to housing 1010. Hidden screw hole 1020 may be located in, for example, an inner wall of SIM tray slot 1022 of housing 1010. SIM tray slot 1022 can be operable to receive SIM tray 1024 such that, for example, surface 1026 of SIM tray 1024 lies substantially flush with surface 1012 of housing 1010 when SIM tray 1024 has been inserted in SIM slot 1022. Moreover, after SIM tray 1024 has been inserted in SIM tray slot 1022, screw hole 1020 can be hidden from sight. Hiding screw hole 1020 in this manner may, for example, make it more difficult for an end user of electronic device 1000 to locate the hidden screw and remove back cover assembly 1040 from housing 1010. In this manner, an end user may be prevented and/or discourage from opening up electronic device 1000, tampering with the inner components of electronic device 1000, or both.

Figure 11A:
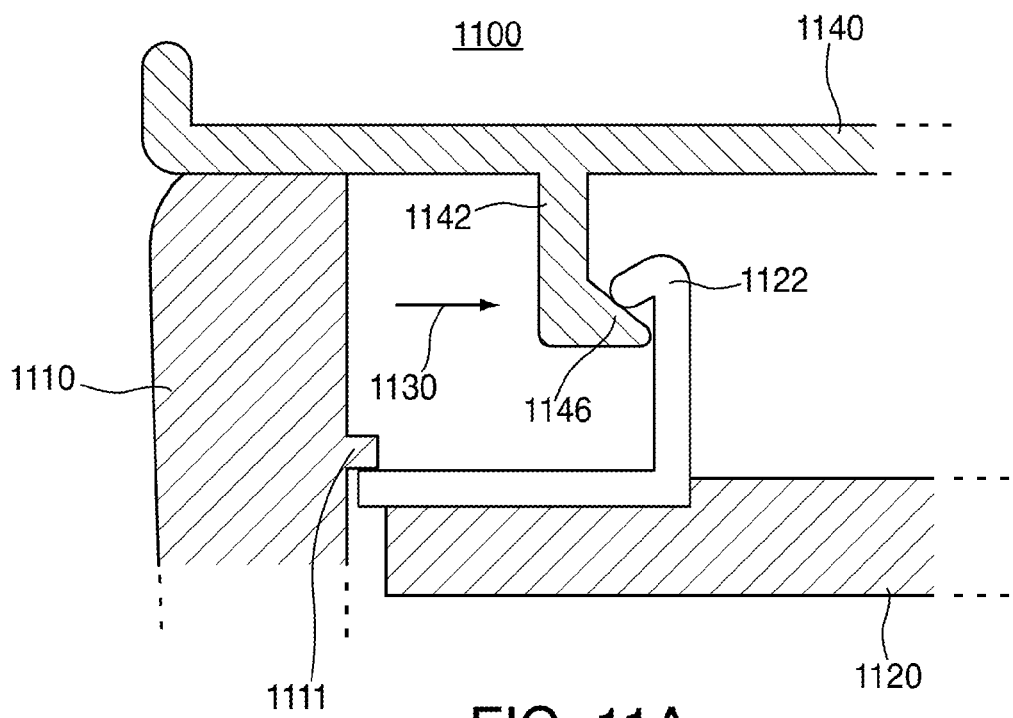
FIG. 11A shows a portion of an electronic device including an internal platform with one or more retention features in accordance with some embodiments.

In some embodiments, one or more retention features can be included on an internal platform of an electronic device. These retention features may then cooperate with one or more retention features of a cover assembly to retain the cover assembly to the electronic device. For example, FIG. 11A shows a portion of electronic device 1100 in which an internal platform can include one or more retention features. Electronic device 1100 can include outer periphery member 1110, internal platform 1120, and back cover assembly 1140. Outer periphery member 1110, internal platform 1120, and back cover assembly 1140 may correspond to, for example, outer periphery member 220, internal platform 240, and back cover assembly 260 of FIGS. 2A-C. Electronic device 1100 can also include any other suitable components such as a front cover assembly (not shown). Back cover assembly 1140 can include one or more retention features such as top hook 1142. Internal platform 1120 can then include one or more retention features such as internal platform hook 1122 that can interact with top hook 1142 to retain back cover assembly 1140 to electronic device 1100. For example, top hook 1142 can interact with internal platform hook 1122 to pull back cover assembly 1140 against outer periphery member 1110, thus resulting in a small or trivial gap between outer periphery member 1110 and back cover assembly 1140. Outer periphery member 1110 can include one or more protruding portions 1111 which can extend from outer periphery member 1110 towards the interior of electronic device 1100. Protruding portion 1111 can engage a portion of internal platform 1120 in order to couple internal platform 1120 to outer periphery member 1110.

To couple back cover assembly 1140 to electronic device 1100, back cover assembly 1140 can be slid over outer periphery member 1110 in direction 1130. When sliding in direction 1130, top hook 1142 can encounter and engage with internal platform hook 1122, thereby maintain back cover assembly 1140 in position. In some embodiments, top hook 1142 can include slope 1146 such that top hook 1142 is angled downwards in shape. In this case, when internal platform hook 1122 couples with top hook 1142, slope 1146 can create an increased force pulling top hook 1142 (e.g., thus also pulling back cover assembly 1140) towards internal platform 1120. This will, in turn, increase the forces pulling back cover assembly 1140 against outer periphery member 1110, thus snugly retaining back cover assembly 1140 to electronic device 1100.

Figure 11B:
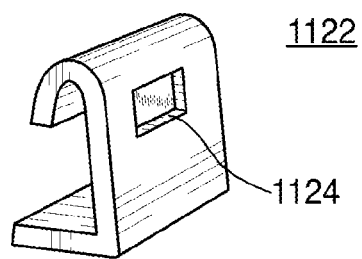
FIG. 11B shows a internal platform retention feature in accordance with some embodiments.

FIG. 11B shows a close-up, perspective view of internal platform hook 1122. Internal platform hook 1122 can be formed from any suitable material such as, for example, plastic, steel, nickel, any other suitable metal, or any other suitable material. In some embodiments, internal platform hook 1122 and internal platform 1120 can be formed from a single piece of material. For example, internal platform hook 1122 and internal platform 1120 can be formed from a single plastic injection mold (e.g., when they are formed from plastic) or from a single die-cast mold (e.g., when they are formed from metal). In some embodiments, internal platform hook 1122 can be formed separately from internal platform 1120 and then coupled to internal platform 1120. In this case, internal platform 1120 and internal platform hook 1122 can be formed from different materials. For example, internal platform 1120 may be formed from plastic (e.g., by a plastic injection mold) and internal platform hook 1122 can be formed from a metal. In some embodiments, internal platform hook 1122 can include slot 1124.

Figure 12A:
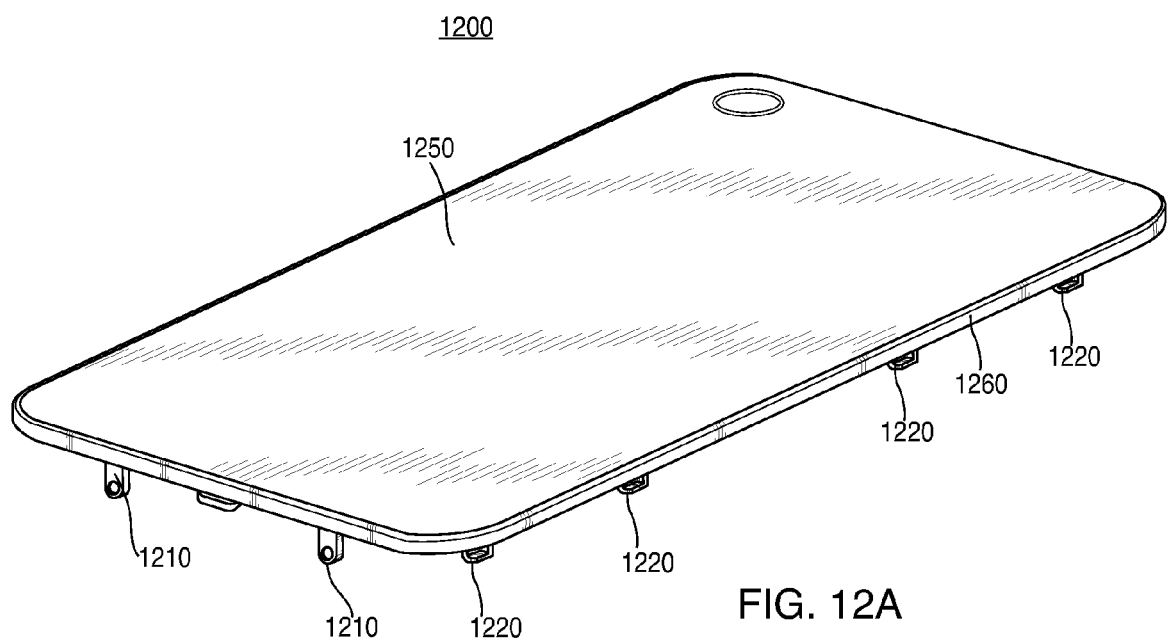
FIGS. 12A and 12B show an illustrative back cover assembly in accordance with some embodiments.
Figure 12B:
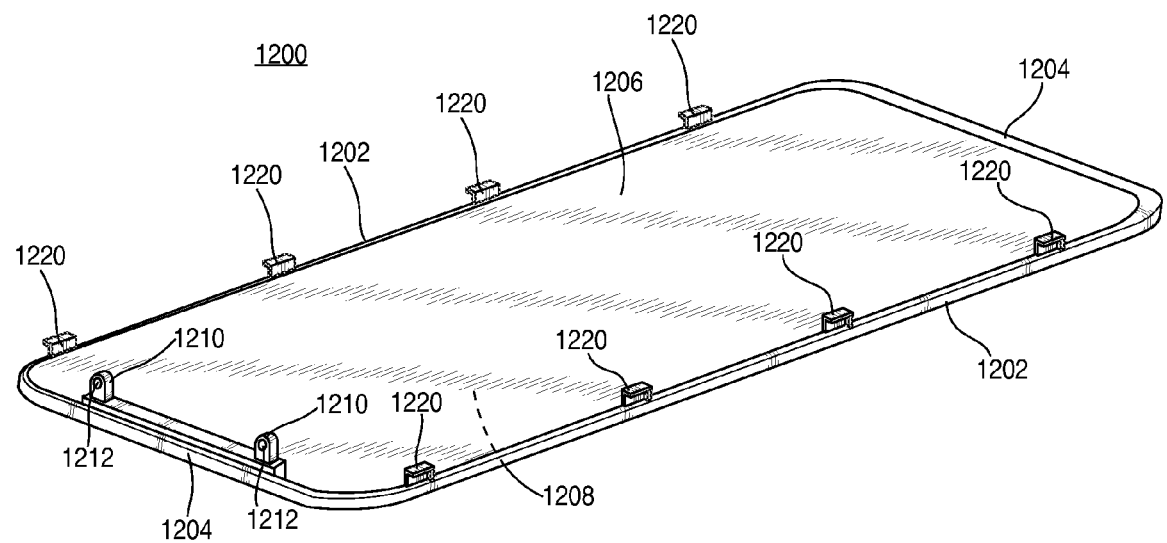

FIGS. 12A and 12B are perspective views of a removable back cover assembly 1200, in accordance with some embodiments of the present invention. FIG. 12A can illustrate a top view of back cover assembly 1200 and FIG. 12B can illustrate a bottom view of back cover assembly 1200. Back cover assembly 1200 may generally correspond to any of those previously described herein, such as, for example, back cover assembly 360 of FIG. 3. Back cover assembly 1200 may, for example, be a front or back cover assembly. Back cover assembly 1200 may be made removable from the other components of an electronic device in a variety manners. In some embodiments, back cover assembly 1200 may be configured to slide relative to the rest of the electronic device. In this embodiment, the electronic device may include a corresponding housing component that mates with back cover assembly 1200 to form the external surfaces of the electronic device. For example, such a "sliding embodiment" can be illustrated by FIG. 4A.

As shown in FIG. 12B, back cover assembly 1200 can include two length-wise edges 1202, two width-wise edges 1204, inner surface 1206, and outer surface 1208 (hidden from sight in the view illustrated by FIG. 12B). Inner surface 1206 can couple to a housing of the electronic device, such that inner surface 1206 can be contained within the electronic device. Outer surface 1208, on the other hand, can remain on the outside of the electronic device after back cover assembly 1200 is coupled to the electronic device, and thus may be readily viewable by an end-user of the electronic device. In other words, outer surface 1208 may form a portion of the external surfaces of the electronic device.

In some embodiments, back cover assembly 1200 can include a glass layer that can be coupled to outer surface 1208. Such a glass layer may, for example, provide aesthetic appeal and/or protection for the electronic device. In this case, back cover assembly 1200 can be formed from one or more layers that are coupled together. For example, as described in greater detail with respect to FIG. 17B, back cover assembly 1200 can include an inner, insert-molded metal layer that can be coupled to an outer glass layer through a suitable adhesive, and any other suitable layers.

In some embodiments, back cover assembly 1200 can include one or more holes (not shown) for receiving at least a portion of a camera assembly. For example, the hole can allow a lens of the camera assembly to "see" outside of the electronic device to capture images. In some embodiments, back cover assembly 1200 can include one or more holes (not shown) that can be filled with plastic for allowing antenna signals to pass from within the electronic device to the outside. For example, when at least a portion of backplate 1200 is formed from metal, the metal may prevent antenna signals from effectively leaving the electronic device. Accordingly, in this case, the antenna signals may instead travel through the holes filled with plastic to exit to the outside environment.

The removable back cover assembly 1200 may include one or more retention features that coincide with corresponding retention features included on the rest of the electronic device (e.g., on the housing, the outer peripheral member, or any other suitable part of the electronic device). For example, as illustrated by FIG. 3B, retention features 390 on the back cover assembly may engage corresponding retention features on outer peripheral member 320 thereby securing the two pieces together. The retention features may be widely varied. For example, the retention features can include one or more detent features, screw features, hidden screw features, top hooks, shuttles, latches, or any combination of the above. In most cases, a number of retention features can be dispersed about the periphery of back cover assembly 1200 in order to create a number of locking points (e.g., and thus a better connection) between the mating parts.

In some embodiments, back cover assembly 1200 can include different sets of retention features. For example, the removable back cover assembly 1200 may include a first set of retention features 1210 and a second set of retention features 1220. These different sets may have a different configurations and may provide different locking functionality.

In some embodiments, the first set of retention features 1210 can include abutment posts and locking features. Such locking features may be widely varied. For example, snaps, threads, cams, and/or the like may be used. In one implementation, retention features 1210 can include threads (e.g., positioned within hole 1212) that can receive screws so as to hold back cover assembly 1200 relative to the electronic device. For example, in this case, retention features 1210 can sometimes be referred to herein as "screw plates 1210." Moreover, this may be similar to what is shown in FIG. 8. In this embodiment, the abutment posts can push up against a portion of the electronic device when back cover assembly 1200 is inserted relative to the electronic device. By way of example, the abutment posts may push up against outer peripheral member 320 (e.g., shown in FIG. 3B).

Alternatively or additionally, the abutment posts may abut a secondary member of the electronic device (e.g., an internal feature of the electronic device which may not necessarily be a portion of the housing). When in the closed position, screws may be placed through openings in the electronic device and secured in the threads in holes 1212 of the abutment posts, thereby locking back cover assembly 1200 in place relative to the electronic device. Any number of abutment posts may be used. For example, in the illustrated embodiment shown by FIGS. 12A and 12B, a pair of abutment posts are used. Moreover, the abutment posts are illustrated as spaced apart. In some cases, the abutment posts can be equally spaced apart from the center of back cover assembly 1200. This may, for example, help with providing a stable interface for back cover assembly 1200.

In some embodiments, the second set of retention features 1220 can include sliding locking features. In this case, retention features 1220 may sometimes be generally referred to herein as "hooks 1220." Such sliding locking features can include linear recesses, grooves, pockets, and the like that can trap a corresponding feature on the electronic device when back cover assembly 1200 is slid relative to the electronic device. During sliding, the retention features of the device and retention features 1220 of back cover assembly 1200 can move between an open position where both retention features are free from one another and a closed position where both retention features engage and lock in place. For example, retention features on the device may become trapped within the linear recesses of retention features 1220.

The linear recesses of retention features 1220 may provide alignment functionality as well. For example, they may help position the x, y and z position of back cover assembly 1200 relative to the electronic device. As another example, the linear retention features may have x, y and/or z reference surfaces depending on their location on back cover assembly 1200. In one example, linear retention feature 1220 can include a wall portion, a flange portion and/or a back abutment portion. The wall portion may help set the x position of the back cover assembly relative to the electronic device. The flange portion may help set the z position of the back cover assembly relative to the electronic device. The back abutment portion may help set the y position of hosing plate 1200 relative to the electronic device.

Any number of instances of retention features may be used. For example, although a certain configuration for and number of instances of retention features 1210 and 1220 are illustrated in FIGS. 12A and 12B, this is for the purpose of illustration and one skilled in the art could appreciate that any other suitable configuration and number of instances could alternatively be used. For example, in some embodiments two instances of retention feature 1210 could be included, where each instance is located on the same width-wise edge 1204. As another example, in some embodiments eight instances of retention feature 1220 could be included, where four of these instances are located on one of the length-wise edges 1202 and the other four instances are located on the opposite length-wise edge 1202.

However, generally several retention features can be used along the length or periphery of the back cover assembly. In this example shown by FIGS. 12A and 12B, eight instances of retention feature 1220 are provided. The retention features 1220 can be spaced apart about the length of back cover assembly 1200 to provide several attachment points thereby helping to stabilize the interface between back cover assembly 1200 and the electronic device. As shown by FIG. 12B, retention features 1220 may be placed on opposing sides of back cover assembly 1200. Retention features 1220 may be equally positioned or they may be asymmetric with regards to the retention features 1220 on the opposing side of back cover assembly 1200. In particular, the specific configuration used can be generally dependent on the electronic device and the internal components, and available space within the device.

Back cover assembly 1200 may be formed from a single material. For example, it may be formed from a single, injection-molded part. That is, back cover assembly 1200 and retention features (e.g., retention features 1210 and/or 1220) can formed together as a single part during a single processing step. Alternatively or additionally, the retention features may be formed separately from and subsequently attached to back cover assembly 1200. For example, the retention features can be attached with adhesive, fasteners, or the like. Alternatively, back cover assembly 1200 may also be formed from multiple materials/parts.

Back cover assembly 1200 may, for example, include a main plate 1250 and a peripheral rim 1260 that can be coupled together to form back cover assembly 1200. These two parts may be attached using adhesives, insert-molding, or through any other suitable technique. In one implementation, peripheral rim 1260 can wrap around or surround the side edges of main plate 1250 (e.g., can wrap around length-wise edges 1202 and width-wise edges 1204). Furthermore, in some cases, peripheral rim 1260 may wrap underneath back cover assembly 1200 such that it covers at least a portion of the under surface of the main plate 1250 (e.g., at least a portion of inner surface 1206).

Main plate 1250 and peripheral rim 1260 may be formed from the same or different materials. In some embodiments, main plate 1250 can be formed from a first materials and peripheral rim 1260 can formed from a second material, where the first and the second material are different. In one implementation, main plate 1250 can include at least an outer transparent or translucent member. This transparent or translucent outer member may, for example, be formed from glass. In one implementation, peripheral rim 1260 may be formed from a plastic material. However, it should be understood that other materials such as metal, ceramics, or any other suitable material may be used.

Alternatively, rather than translucent or transparent members, main plate 1250 may include opaque members. These opaque members may, for example, be formed from ceramics, metals, plastics, and the like. Although a single layer may be used to form main plate 1250 and peripheral rim 1260, in some cases main plate 1250 and peripheral rim 1260 may include additional layers. For example, they may include a stiffening or structural plate. In this case, the main plate 1250 may be integrally formed with the peripheral rim 1260. In one example, this structural plate can be over-molded to form a single part, where this single part includes the structural plate and peripheral rim 1260. Some of these embodiments will be discussed in greater detail below.

Figure 13:
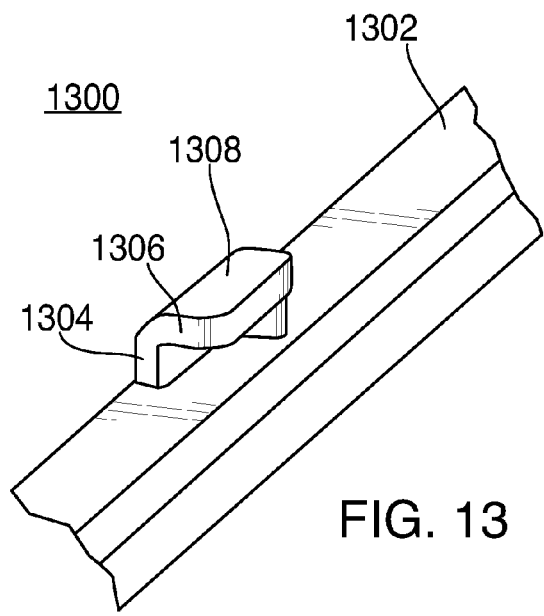
FIGS. 13, 14, 15A, and 15B show illustrative retention features of a back cover assembly in accordance with some embodiments.

FIG. 13 is a perspective diagram of retention feature 1300, in accordance with some embodiments of the present invention. Retention feature 1300 may generally correspond to retention feature 1220 shown in FIGS. 12A and 12B. As shown, retention feature 1300 may be coupled with back cover assembly 1302. In some cases, retention feature 1300 may be integrally formed with back cover assembly 1302 or a portion of back cover assembly 1302. As shown, retention feature 1300 can include a side wall 1304 that protrudes away from back cover assembly 1302. Side wall 1304 may protrude from back cover assembly 1302 at a substantially perpendicular angle. Retention feature 1300 can also include back abutment 1306 that extends outwardly from back cover assembly 1302 and can be adjacent to and perpendicular relative to side wall 1304. In other words, together side wall 1304 and back abutment 1306 may form an "L-shape" against back cover assembly 1302. Retention feature 1300 can also include a flange portion 1308 that can bends off of side wall 1304 at a perpendicular angle. Flange portion 1308 can be substantially parallel with back cover assembly 1302. Each of these components of retention feature 1300 can help form a recess, groove, pocket, or the like for trapping a corresponding element of the electronic device, thereby helping to secure back cover assembly 1302 to the electronic device.

As illustrated in FIG. 13, if retention feature 1300 is considered to be a box, then retention feature 1300 includes two open sides. Moreover, in FIG. 13 flange portion 1308 is illustrated as flaring outward away from the center of back cover assembly 1302. This configuration is also illustrated by retention features 1220 of FIG. 12B. However, in some cases, flange portion 1308 may be flare inwardly toward the center of back cover assembly 1302. In some cases, various instances of retention feature 1300 may even be set up differently, where some flare inwardly and some flare outwardly.

Figure 14:
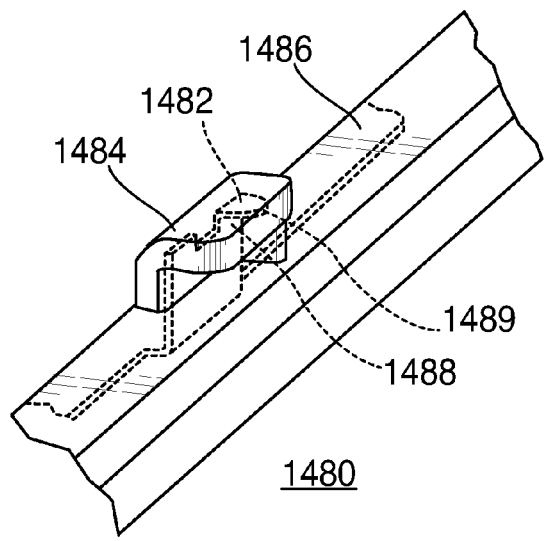

FIG. 14 is a transparent, perspective view of retention feature 1480 that may, for example, correspond to a transparent view of retention feature 1300 of FIG. 13. In other words, by being transparent, FIG. 14 may illustrate any internal structures of retention feature 1480. In this embodiment, retention feature 1480 can be formed from multiple parts. Retention feature 1480 can include inner skeleton frame 1482 and outer hook feature 1484. Inner skeleton frame 1482 can help provide strength and stability to retention feature 1480. In some cases, the inner skeleton frame 1482 can be formed from metal that is interconnected with other portions of back cover assembly 1486. Thus, this protruding retention feature 1480 can be rooted to a more stable structure, thereby giving it added rigidity. Inner skeleton frame 1482 may have a similar shape to retention feature 1300 of FIG. 13 (i.e., a side wall, back abutment and flange portion). In other cases, inner skeleton frame 1482 may only provide a limited structure. For example, as shown in FIG. 14, inner skeleton frame 1482 may include tab 1488 that can extend outwardly away from the surface of back cover assembly 1486 and tooth 1489 that can form a small flange portion. In some cases, hook feature 1484 can be over-molded onto inner skeleton frame 1482. For example, inner skeleton frame 1482 may be insert-molded from metal, and hook feature 1484 may then be formed by over-molding plastic onto this metal.

Figure 15A:
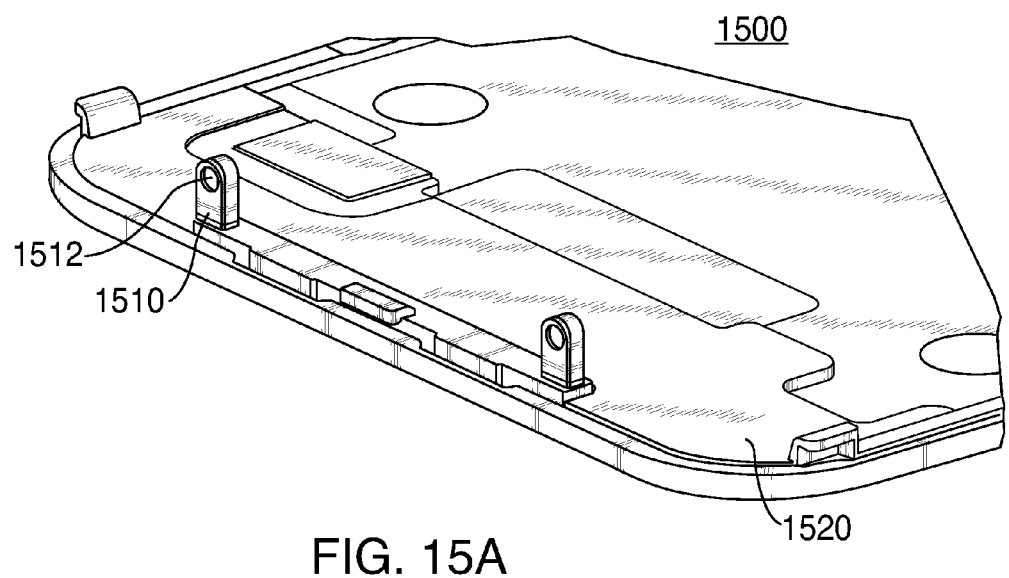
Figure 15B:
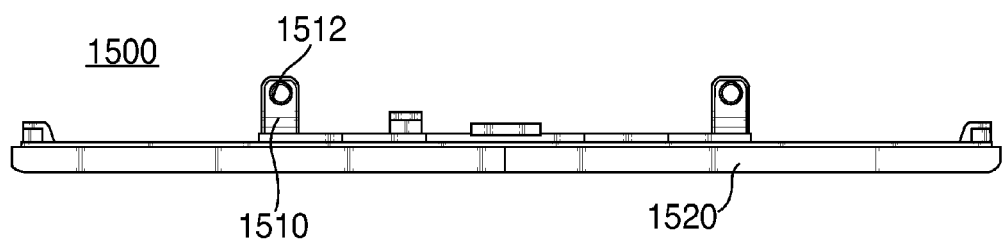

FIGS. 15A and 15B show a perspective view and a side view of retention feature 1500, respectively, in accordance with some embodiments of the invention. In this embodiment, retention feature 1500 can include at least one abutment post 1510 that can extend upwardly from back cover assembly 1520. In some cases, two or more spaced apart abutment posts 1510 may be used. Abutment post 1510 can include threaded portion 1512 proximate the top of the post. Threaded portion 1512 may correspond with holes in the electronic device and may be used in securing back cover assembly 1520 to the electronic device via fasteners (e.g., screws, and the like). Abutment posts 1510 may include rounded ends. The posts may be molded within the back cover assembly.

Figure 16:
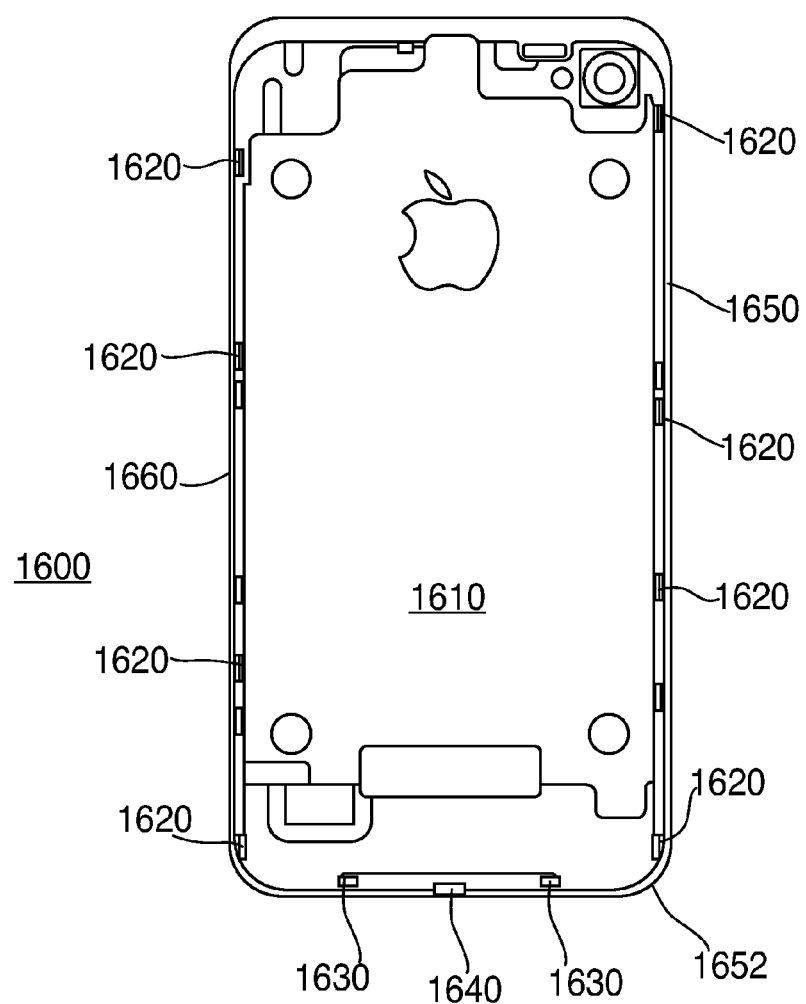

FIG. 16 is a top view of the under surface of back cover assembly 1600, in accordance with some embodiments of the present invention. Back cover assembly 1600 can include platform 1610 and a plurality retention features spaced about the peripheral edge of platform 1610. At a first end, a pair of spaced apart abutment posts 1630 with locking threads may be provided. For example, abutment posts 1630 can correspond to abutment posts 1510 of FIGS. 15A and 15B. Abutment posts 1630 may be located along a flat side of first end 1640 but closer to the corner than to the center of first end 1640. On first side 1650, a plurality of spaced, sliding locking features 1620 can be provided along the length of first side 1650. In the illustrated embodiment, at least one of the instances of sliding locking features 1620 can be disposed within rounded corner 1652 of platform 1610. The sliding locking features 1620 may also be on second side 1660, where second side 1660 can be directly opposite first side 1650. The sliding locking features 1620 may be placed at similar and/or different locations relative to the opposing side as shown. For example, they may alternate along the lengths of first side 1650 and second side 1660, and/or they may be placed at the same points in the corners of platform 1610.

Figure 17A:
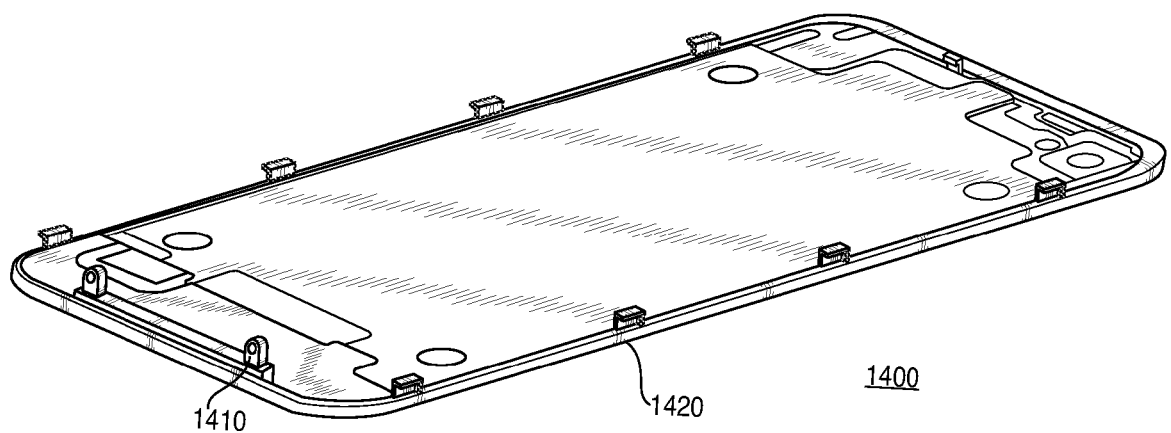

FIGS. 17A and 17B show a perspective view and an exploded view, respectively, of back cover assembly 1400. For example, back cover assembly 1400 can correspond to back cover assembly 1200 of FIGS. 12A and 12B. Similar to back cover assembly 1200, back cover assembly 1400 can include one or more screw plates and hooks such as screw plate 1410 and hook 1420, respectively. In some embodiments, back cover assembly 1400 can be formed from several different layers. For example, as illustrated in FIG. 17B, back cover assembly can be formed from glass layer 1430, adhesive layer 1440, metal layer 1450, and plastic layer 1460.

Glass layer 1430 can provide an aesthetically pleasing surface and/or protection for back cover assembly 1400. For example, glass layer 1430 can be treated to resist wear or impacts (e.g., scratch resistance), resist oils from touching, or resist any other external force applied to the device. In some embodiments, glass layer 1430 can be given a particular finish using one or more masks, coatings (e.g., photochromatic or dichroic), ink layers, or the like.

In some cases, glass layer 1430 can include one or more openings for device components or for other suitable functions. For example, glass layer 1430 can include opening 1432 for receiving lens 1434 of a camera device (e.g., where the remaining structural and electrical components of the camera device may be located within an electronic device to which back cover assembly 1400 is coupled). Opening 1432 may accordingly allow lens 1434 to "see" outside of the electronic device and capture images. In some embodiments, lens 1434 can be coupled to glass layer 1430 through a suitable adhesive, such as adhesive 1436.

Metal layer 1450 may, for example, include a steel reinforcement plate that can provide structure and support for back cover assembly 1400. In some cases, metal layer 1450 can be formed by insert molding the metal into an appropriate mold. Moreover, in some embodiments, retention features such as screw plate 1410 and/or hook 1420 can be coupled to metal layer 1450. As an example, such retention features can be formed separately from and subsequently coupled to metal layer 1450. As another example, these retention features can be formed as a part of metal layer 1450. For example, a single mold can be used to insert mold both metal layer 1450 and screw plate 1410 and/or hook 1420 in the same processing step. In some embodiments, screw plate 1410 and/or hook 1420 can be formed through metal injection molding.

In some embodiments, metal layer 1450 can include one or more openings for device components or for other suitable functions. For example, metal layer 1450 can include opening 1452 for receiving lens 1434 of a camera device or for receiving any other suitable device. As another example, metal layer 1450 can include one or more openings such as opening 1454 for allowing antenna signals to pass from within an electronic device coupled to backplate 1400 to the outside environment. For example, metal materials such as metal layer 1450 may effectively prevent antenna signals from leaving an electronic device. Accordingly, an opening such as opening 1454 can provide a suitable gateway for allowing the antenna signals to exit the device. In some embodiments, opening 1454 can be filled with a material that does not impede the passage of antenna signals, such as plastic or any other suitable material.

As shown in FIG. 17B, plastic layer 1460 can be coupled over metal layer 1450. In some embodiments, plastic layer 1460 can be formed by overmolding the plastic onto the metal after metal layer 1450 has been formed. Plastic layer 1460 can cover any suitable portions of metal layer 1450 and may, for example, provide additional structure, reinforcement, and/or features for back cover assembly 1400. In some embodiments plastic layer 1460 can be overmolded onto retention features (e.g., screw plate 1410, hook 1420, and the like) to provide additional support, features, and/or detail for these retention features. In some embodiments, the retention features can be formed completely from plastic layer 1460. For example, rather than insert-molding screwplate 1410 and/or hook 1420 from metal, the features can be formed by overmolding plastic into the desired retention features.

In some embodiments, plastic layer 1460 can include wall 1462. Wall 1462 may, for example, circumscribe the entire perimeter of backplate 1400. Wall 1462 can provide a suitable boundary for receiving and retaining glass layer 1430 in place. This may, for example, ensure proper alignment of glass layer 1430 with the other component of back cover assembly 1400.

Adhesive layer 1440 can couple metal layer 1450 (e.g., and/or plastic layer 1460) to glass layer 1430. In some embodiments, a separate adhesive such as a liquid adhesive (not shown) can be used to couple some or all of the components of back cover assembly 1400 to glass layer 1430. For example, in some embodiments a liquid adhesive can be used to couple plastic layer 1460 to glass layer 1430, while adhesive layer 1440 can be used to couple metal layer 1450 to glass layer 1430.

Figure 18:
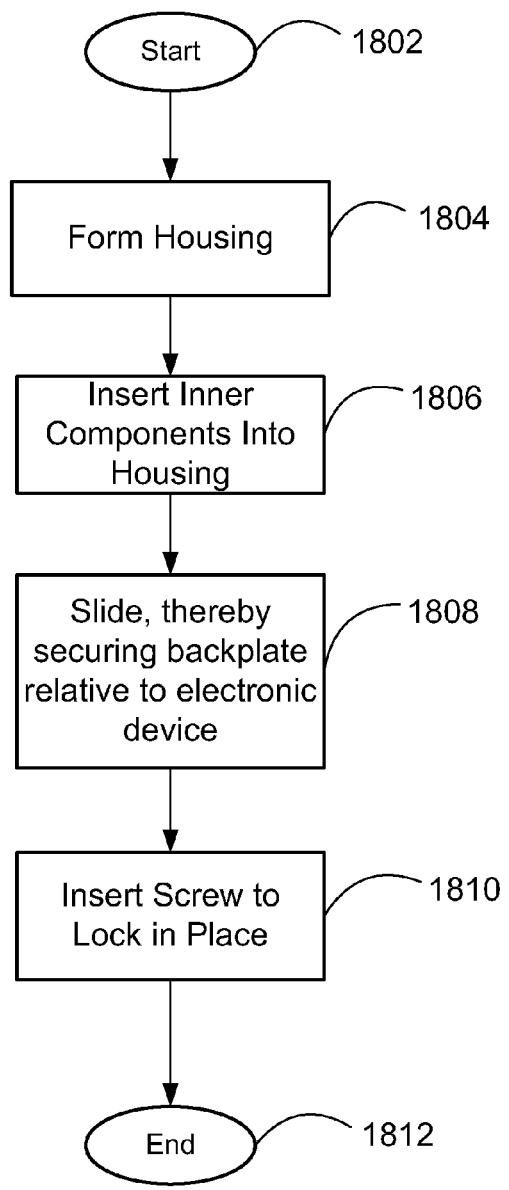
FIG. 18 shows a process for assembling an electronic device in accordance with some embodiments.

FIG. 18 is a flow chart of an illustrative process for assembling an electronic device in accordance with some embodiments of the invention. Process 1800 can begin at step 1802. At step 1804, a housing can be formed. For example, when a "bucket" type approach is used to form the housing, the housing can be formed into a bucket-like shape into which inner electronic device components can placed. As another example, when a "band" type approach is used to form the housing, the housing can be created from, for example, a outer periphery member, a combination of a outer periphery member and internal platform, and the like (e.g., outer periphery member 220 and internal platform 240 of FIGS. 2A-C).

At step 1806, inner components can be inserted into the housing. For example, when the housing is formed from a bucket type approach at step 1804, the inner components can be inserted from the top of the housing. As another example, when a band type approach is used to form the housing at step 1804, the inner components can be inserted into the device from one or both sides of the outer periphery member (e.g., the inner components can be coupled to one or both sides of the internal platform)

At step 1808, the back cover assembly can be slid, thereby securing the back cover assembly relative to an electronic device. For example, the back cover assembly can be slide as illustrated by FIGS. 4A-4B. In some embodiments, as the back cover assembly is slid, retention features on the back cover assembly and or electronic device can operate to secure the back cover assembly. For example, retention features such as one or more ridges, hooks, tabs, extensions, detent features, screw holes, screw plates, shuttles, any other suitable retention feature, or any combination of the above can be used to retain the back cover assembly. In some embodiments, detent features such as a pin and detent spring can be used. In some embodiments, detent features such as a latch and pawl can be used. In some embodiments, the retention features can be included on the back cover assembly, the housing, an internal platform, or any combination of the above. In some embodiments, retention features such as retention features 1210 and/or 1220 of FIG. 12B can be used. Moreover, one skilled in the art could appreciate that any other suitable cover can be retained to the electronic device in this manner. For example, when a band type approach is used to form the housing at step 1804, these retention features can be used to retain a front cover assembly (e.g., front cover assembly 250 of FIGS. 2A-C) to the housing.

At step 1810, a screw can be inserted to lock the back cover assembly into place. For example, a screw can be inserted through a screw plate or other retention feature of the back cover assembly. The screw may also pass through a comparable feature of the electronic device, thereby securing the back cover assembly in place relative to the electronic device.

In some embodiments, step 1810 can include a hidden screw feature. For example, a hidden screw can be inserted in a SIM tray slot of the electronic device. In this case, a screw hole can be included on an inner surface of the SIM tray slot. A complimentary screw plate may then be included on the back cover assembly of the electronic device. The hidden screw can be inserted through the screw hole and screw plate to retain the back cover assembly to the housing. In some embodiments, a SIM tray may then be inserted into the SIM tray slot. In this manner, the hidden screw can be covered and effectively hidden from an end user of the electronic device. This may, for example, inhibit and/or prevent an end user from removing the back cover assembly of the electronic device, tampering with the inner components of the electronic device, or both. Process 1800 can then end at step 1812.

The processes discussed herein are intended to be illustrative and not limiting. Persons skilled in the art can appreciate that steps of the processes discussed herein can be omitted, modified, combined, or rearranged, and any additional steps can be performed without departing from the scope of the invention. As an example, in some embodiments a screw feature may not be included and step 1810 can be omitted.

It will be apparent to those of ordinary skill in the art that methods involved in the invention may be embodied in a computer program product that includes a machine readable and/or usable medium. For example, such a computer usable medium may consist of a read-only memory device, such as a CD ROM disk or conventional ROM device, or a random access memory, such as a hard drive device or a computer diskette, or flash memory device having a computer readable program code stored thereon.

The previously described embodiments are presented for purposes of illustration and not of limitation. It is understood that one or more features of an embodiment can be combined with one or more features of another embodiment to provide systems and/or methods without deviating from the spirit and scope of the invention.

What is claimed is:

1. A portable electronic device comprising:
    an outer periphery member defining a loop, wherein the outer periphery member comprises:
        a top surface;
        a bottom surface; and
        an inner surface that defines the inner circumference of the loop,
    the inner surface having a protruding portion extending inwardly therefrom;
    an internal platform coupled to the inner surface of the outer periphery member, wherein the internal platform comprises at least one internal platform hook, the internal platform fixed to the protruding portion by the at least one internal platform hook; and
    a back cover assembly placed adjacent to the bottom surface of the outer periphery member, wherein the back cover assembly comprises at least one top hook operable to couple with the internal platform hook to retain the back cover assembly to the outer periphery member.

2. The portable electronic device of claim 1, wherein the top hook comprises a slope, and wherein the internal platform hook contacts the top hook at the slope to produce a force pulling the back cover assembly towards the outer periphery member.

3. The portable electronic device of claim 1, wherein the internal platform hook comprises a slot on an outer surface of the internal platform hook.

4. The portable electronic device of claim 1, wherein the internal platform is coupled to at least two distinct regions of the inner surface and the internal platform is offset from the top surface and bottom surface of the outer periphery member.

5. The portable electronic device of claim 1, further comprising:
    a front cover assembly placed adjacent to the top surface of the outer periphery member, wherein the front cover assembly comprises a transparent window allowing display circuitry to be viewed.

6. The portable electronic device of claim 1, wherein the back cover assembly covers the entirety of the bottom surface of the outer periphery member.

7. The portable electronic device of claim 1, wherein the back cover assembly covers less than the entirety of the bottom surface of the outer periphery member such that a portion of the bottom surface is viewable, and wherein the viewable portion comprises a uniform width defining an outer boundary of the bottom surface.

* * * * *